US012606742B2

(12) United States Patent
Zhong et al.

(10) Patent No.: US 12,606,742 B2
(45) Date of Patent: *Apr. 21, 2026

(54) METHOD FOR PREPARING QUANTUM DOT, QUANTUM DOT, AND DISPLAY DEVICE

(71) Applicant: BOE TECHNOLOGY GROUP CO., LTD., Beijing (CN)

(72) Inventors: Haizheng Zhong, Beijing (CN); Zhiwei Long, Beijing (CN); Gaoling Yang, Beijing (CN); Kai Gu, Beijing (CN); Yang Liu, Beijing (CN); Zhuo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 606 days.

This patent is subject to a terminal disclaimer.

(21) Appl. No.: 17/750,965

(22) Filed: May 23, 2022

(65) Prior Publication Data

US 2022/0282155 A1 Sep. 8, 2022

Related U.S. Application Data

(63) Continuation-in-part of application No. 17/598,638, filed as application No. PCT/CN2020/139548 on Dec. 25, 2020, now Pat. No. 12,221,575.

(30) Foreign Application Priority Data

Mar. 11, 2022 (WO) ................ PCT/CN2022/080298

(51) Int. Cl.
*C09K 11/88* (2006.01)
*B82Y 20/00* (2011.01)
(Continued)

(52) U.S. Cl.
CPC ........... *C09K 11/883* (2013.01); *B82Y 20/00* (2013.01); *B82Y 40/00* (2013.01); *C01B 19/007* (2013.01); *H10K 50/115* (2023.02)

(58) Field of Classification Search
CPC ........................... C09K 11/883; C01B 19/007
See application file for complete search history.

(56) References Cited

U.S. PATENT DOCUMENTS 5,260,957 A * 11/1993 Hakimi ..................... H01S 5/30
372/39
12,221,575 B2 * 2/2025 Zhong ..................... C01G 9/00
(Continued)

FOREIGN PATENT DOCUMENTS

CN 1657589 A 8/2005
CN 1834198 A 9/2006
(Continued)

OTHER PUBLICATIONS

Extended European Search Report corresponding to European Patent Application No. 20966609.8 (11 pages) (dated Nov. 8, 2023).
(Continued)

*Primary Examiner* — C Melissa Koslow
(74) *Attorney, Agent, or Firm* — Myers Bigel, P.A.

(57) ABSTRACT

A method for preparing a quantum dot, a quantum dot, and a display device, are provided. The method includes the following steps: providing a first precursor solution, a second precursor solution, a first selenium precursor solution, and a second selenium precursor solution with a lower reaction activity than the first selenium precursor solution; adding the first selenium precursor solution to the second precursor solution to form an intermediate of the quantum dot; performing the following step at least once to form the quantum dot: adding the first precursor solution and the
(Continued)

100 second selenium precursor solution to the intermediate of the quantum dot and making them react.

33 Claims, 7 Drawing Sheets

(51) Int. Cl.
*B82Y 40/00* (2011.01)
*C01B 19/00* (2006.01)
*H10K 50/115* (2023.01)

(56) References Cited

U.S. PATENT DOCUMENTS

| | | | |
|---|---|---|---|
| 2008/0048571 A1 * | 2/2008 | Yoon | H10K 50/80 |
| | | | 315/169.3 |
| 2009/0065742 A1 | 3/2009 | Shih et al. | |
| 2014/0353579 A1 | 12/2014 | Greco et al. | |
| 2017/0066965 A1 | 3/2017 | Truskier et al. | |
| 2017/0306227 A1 | 10/2017 | Ippen et al. | |
| 2018/0095327 A1 * | 4/2018 | Lee | G02F 1/133617 |
| 2018/0130853 A1 * | 5/2018 | Pan | H10K 59/35 |
| 2020/0407635 A1 | 12/2020 | Kim et al. | |
| 2021/0210706 A1 | 7/2021 | Yu et al. | |

FOREIGN PATENT DOCUMENTS

| | | | |
|---|---|---|---|
| CN | 1865394 A | | 11/2006 |
| CN | 101260294 A | | 9/2008 |
| CN | 101264868 A | | 9/2008 |
| CN | 101428770 A | | 5/2009 |
| CN | 101332979 | * | 6/2010 |
| CN | 101824317 A | | 9/2010 |
| CN | 101428770 B | | 5/2011 |
| CN | 103130201 A | | 6/2013 |
| CN | 103215034 A | | 7/2013 |
| CN | 103694997 A | | 4/2014 |
| CN | 104409592 | * | 11/2015 |
| CN | 107384405 A | | 11/2017 |
| CN | 109370564 A | | 2/2019 |
| CN | 110137363 A | | 8/2019 |
| CN | 110408398 A | | 11/2019 |
| CN | 110790242 A | | 2/2020 |
| CN | 111019628 A | | 4/2020 |
| CN | 111019656 A | | 4/2020 |
| CN | 111117622 A | | 5/2020 |
| CN | 111218269 A | | 6/2020 |
| CN | 112745852 A | | 5/2021 |
| CN | 112824477 A | | 5/2021 |
| CN | 114981385 A | | 8/2022 |
| WO | 2017034226 A1 | | 3/2017 |
| WO | 2019074083 A1 | | 4/2019 |

OTHER PUBLICATIONS

Qin , et al., "A simple and novel route for the synthesis of water soluble ZnSe quantum dots using the Nano-Se as the reaction intermediate", Materials Letters, 2012, 67:28-31.

Wang, Aqiang , et al., "Bright, efficient, and color-stable violet ZnSe-based quantum dot light-emitting diodes", Nanoscale, 2015, 7, Jan. 5, 2015, pp. 2951-2959.

Zhang , et al., "ZnSe Nanostructures: Synthesis, Properties and Applications", Progress in Materials Science, 2016, 83:472-535.

Huang, Ao-Dong , et al., "Phosphine-free Synthesis of Alloyed Zns1-xSex Quantum Dots with Tunable Bandgap Emissions (with English language translation)", Journal of Ningbo University of Technology, vol. 25, No. 4, Dec. 2013, 16 pp.

Li, Lin Song , et al., "High Quality ZnSe and ZnS Nanocrystals Formed by Activating Zinc Carboxylate Precursors", Nano Letters, vol. 4, No. 11, Oct. 14, 2004, pp. 2261-2264.

Ryowa, Tatsuya , et al., "High-efficiency quantum dot light-emitting diodes with blue cadmium-free quantum dots", Journal of Society for Information Display, vol. 28, No. 5, May 1, 2020, pp. 401-409.

Shen, Huaibin , et al., "Phosphine-free synthesis of high quality ZnSe, ZnSe/ZnS, and Cu-, Mn-doped ZnSe nanocrystals", Dalton Transactions, 2009, 47, Oct. 30, 2009, pp. 10534-10540.

Shen, Huaibin , et al., "Size- and shape-controlled synthesis of ZnSe nanocrystals using SeO2 as selenium precursor", Dalton Transactions, 2010, 39, Oct. 26, 2010, pp. 11432-11438.

Wang, Aqiang , et al., "Bright, Efficient, and Color-stable Violet ZnSe-Based Quantum Dots Light-Emitting Diodes", Nanoscale, 2015, 7, Jan. 5, 2015, pp. 2951-2959.

Yu, Kui , et al., "Highly-photoluminescent ZnSe nanocrystals via a non-injection-based approach with precursor reactivity elevated by a secondary phosphine", Chemical Communications, 2011, 47, Jul. 7, 2011, pp. 8811-8813.

Non-Final Office Action issued for U.S. Appl. No. 17/598,638 mailed Jun. 18, 2024 (14 pages).

First Office Action of Chinese patent application 202280000426.X (14 pages) (May 23, 2024).

* cited by examiner

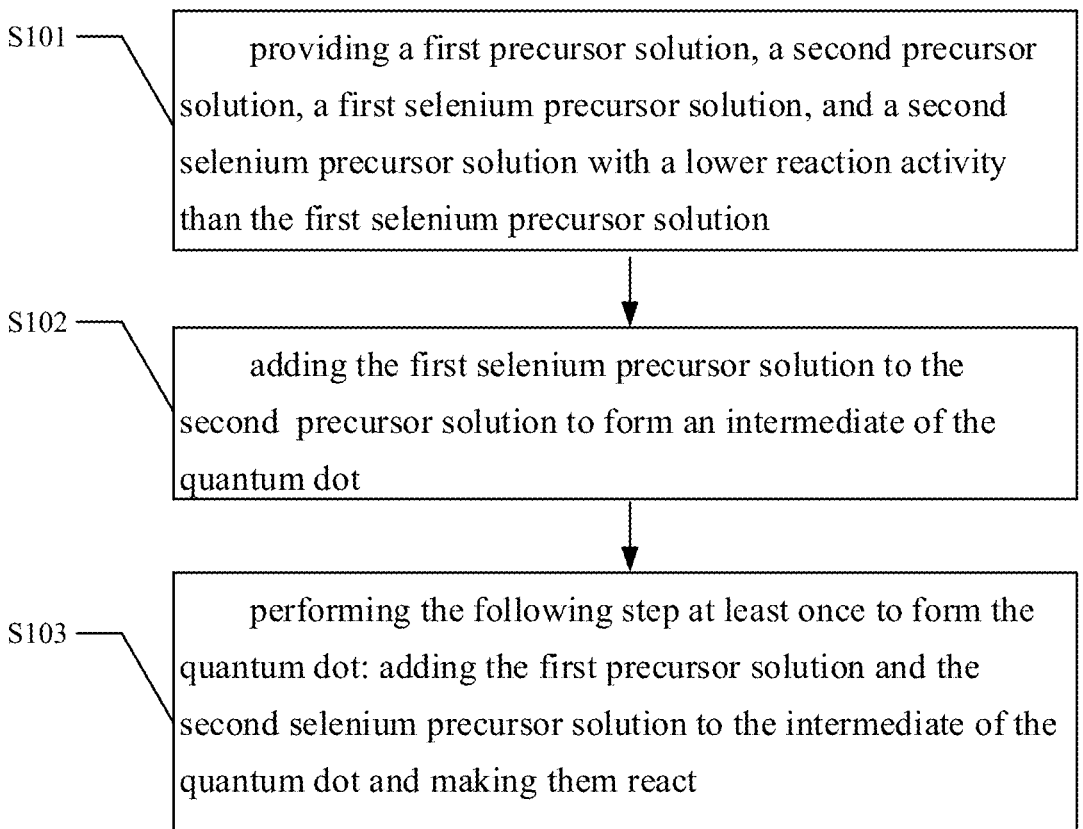

100

S101 — providing a first precursor solution, a second precursor solution, a first selenium precursor solution, and a second selenium precursor solution with a lower reaction activity than the first selenium precursor solution S102 — adding the first selenium precursor solution to the second precursor solution to form an intermediate of the quantum dot S103 — performing the following step at least once to form the quantum dot: adding the first precursor solution and the second selenium precursor solution to the intermediate of the quantum dot and making them react

FIG. 1A

METHOD FOR PREPARING QUANTUM DOT, QUANTUM DOT, AND DISPLAY DEVICE

CROSS-REFERENCE TO RELATED APPLICATIONS

The present application is a Continuation-in-Part of U.S. patent application Ser. No. 17/598,638, filed on Sep. 27, 2021, entitled "METHOD FOR PREPARING ZnSe QUANTUM DOT, ZnSe QUANTUM DOT, ZnSe STRUCTURE AND DISPLAY DEVICE", which itself is a 35 U.S.C. 317 national stage application of PCT International Application No. PCT/CN2020/139548, filed on Dec. 25, 2020, and the present application also claims the benefit of PCT International Application No. PCT/CN2022/080298, filed on Mar. 11, 2022, the entire disclosures of all of which are incorporated herein by reference.

TECHNICAL FIELD

The present disclosure relates to the technical field of nanomaterials, in particular, to a method for preparing a quantum dot, a quantum dot, and a display device comprising the quantum dot.

BACKGROUND

A semiconductor quantum dot, also known as a semiconductor nanocrystal, has attracted wide attention due to its adjustable fluorescence emission peak position, narrower full width at half maximum (FWHM), and higher fluorescence quantum yield. The quantum dot has a specific band gap according to its composition and size, and therefore can absorb light and emit light with a specific wavelength. Currently, the widely researched blue-emitting quantum dot for display application is mainly II-VI semiconductor quantum dot. The ZnSe quantum dot has advantages such as no heavy metal ions, better biocompatibility, and better tunability of fluorescence emission peak positions, and is attracting more and more attention.

SUMMARY

According to an aspect of the present disclosure, a method for preparing a quantum dot is provided, comprising the following steps: providing a first precursor solution, a second precursor solution, a first selenium precursor solution, and a second selenium precursor solution with a lower reaction activity than the first selenium precursor solution; adding the first selenium precursor solution to the second precursor solution to form an intermediate of the quantum dot; performing the following step at least once to form the quantum dot: adding the first precursor solution and the second selenium precursor solution to the intermediate of the quantum dot and making them react.

In some embodiments, the first precursor solution is a first zinc precursor solution, the second precursor solution is a second zinc precursor solution, and the quantum dot is a first ZnSe quantum dot.

In some embodiments, after the step of performing the following step at least once to form the quantum dot, the method further comprises: growing a shell layer on a surface of the first ZnSe quantum dot to form a second ZnSe quantum dot with a core-shell structure. The first ZnSe quantum dot is the core of the second ZnSe quantum dot.

In some embodiments, a band gap of the shell of the second ZnSe quantum dot is greater than a band gap of the core of the second ZnSe quantum dot.

In some embodiments, the shell of the second ZnSe quantum dot is formed by using one or more of ZnS, ZnSeS, MnS, MnO.

In some embodiments, the step of growing a shell layer on a surface of the first ZnSe quantum dot to form a second ZnSe quantum dot with a core-shell structure comprises: adding a sulfur precursor solution to a solution of the first ZnSe quantum dot to grow a first ZnS shell on the surface of the first ZnSe quantum dot to form the second ZnSe quantum dot.

In some embodiments, the step of adding a sulfur precursor solution to a solution of the first ZnSe quantum dot to grow a first ZnS shell on the surface of the first ZnSe quantum dot comprises: adding the sulfur precursor solution to the solution of the first ZnSe quantum dot at 300° C., to form the first ZnS shell with a thickness of two atomic layers on the surface of the first ZnSe quantum dot.

In some embodiments, the sulfur precursor solution comprises sulfur and trioctyl phosphine.

In some embodiments, an average particle size of the second ZnSe quantum dot with the first ZnS shell is about 10.2 nm.

10) In some embodiments, the step of growing a shell layer on a surface of the first ZnSe quantum dot to form a second ZnSe quantum dot with a core-shell structure comprises: adding a zinc sulfide precursor solution to a solution of the second ZnSe quantum dot with the first ZnS shell to continue the growth of the first ZnS shell to form a second ZnS shell.

In some embodiments, the second ZnS shell has a thickness of four atomic layers.

In some embodiments, the step of growing a shell layer on a surface of the first ZnSe quantum dot to form a second ZnSe quantum dot with a core-shell structure comprises: adding the zinc sulfide precursor solution to the solution of the second ZnSe quantum dot with the first ZnS shell at a rate of 4-8 mL/h at 280° C., so that the first ZnS shell continues to grow to form the second ZnS shell on the surface of the first ZnSe quantum dot.

In some embodiments, the zinc sulfide precursor solution comprises octanethiol, zinc acetate, oleylamine, octadecene.

In some embodiments, the molar ratio of octanethiol, zinc acetate, and oleylamine in the zinc sulfide precursor solution is 1:1~1.5:1~1.5.

In some embodiments, an average particle size of the second ZnSe quantum dot with the second ZnS shell is about 11.8 nm.

In some embodiments, a fluorescence quantum yield of the second ZnSe quantum dot with the second ZnS shell is about 60%.

In some embodiments, a material of a solute in the first zinc precursor solution is the same as a material of a solute in the second zinc precursor solution, a material of a solvent in the first zinc precursor solution is the same as a material of a solvent in the second zinc precursor solution, and a ratio of solute to solvent in the first zinc precursor solution is different from a ratio of solute to solvent in the second zinc precursor solution.

In some embodiments, the step of providing a first precursor solution, a second precursor solution, a first selenium precursor solution, and a second selenium precursor solution with a lower reaction activity than the first selenium precursor solution comprises: mixing zinc inorganic salt, organic acid, organic amine and inert solvent in the ratio of 1~10 mmol:1~10 mmol:1~10 mL:10~50 mL, stirring the mixture under the protection of inert gas and heating the mixture until clear to form the first zinc precursor solution.

In some embodiments, the step of providing a first precursor solution, a second precursor solution, a first selenium precursor solution, and a second selenium precursor solution with a lower reaction activity than the first selenium precursor solution comprises: mixing zinc inorganic salt, organic acid, organic amine and inert solvent in a ratio of 0.1~10 mmol:1~10 mL:1~10 mL:1~20 mL, stirring the mixture under the protection of inert gas and heating the mixture to 250° C.~350° C. to form the second zinc precursor solution.

In some embodiments, the step of adding the first selenium precursor solution to the second precursor solution to form an intermediate of the quantum dot comprises: dissolving selenium powder in diphenylphosphine to form the first selenium precursor solution; using oleic acid as the organic acid in the second zinc precursor solution and oleylamine as the organic amine in the second zinc precursor solution, a molar ratio of the oleic acid to oleylamine being 0.2:1; and adding the first selenium precursor solution to the second zinc precursor solution to form the intermediate of the first ZnSe quantum dot with a particle size of about 4.7 nm.

In some embodiments, the first precursor solution is a first cadmium precursor solution, the second precursor solution is a second cadmium precursor solution, and the quantum dot is CdSe quantum dot.

In some embodiments, the first precursor solution is a first lead precursor solution, the second precursor solution is a second lead precursor solution, and the quantum dot is PbSe quantum dot.

In some embodiments, the step of providing a first precursor solution, a second precursor solution, a first selenium precursor solution, and a second selenium precursor solution with a lower reaction activity than the first selenium precursor solution comprises: mixing a selenium precursor and a first selenium precursor solvent in a ratio of 0.1~10 mmol:1~20 mL to form the first selenium precursor solution.

In some embodiments, the step of providing a first precursor solution, a second precursor solution, a first selenium precursor solution, and a second selenium precursor solution with a lower reaction activity than the first selenium precursor solution comprises: mixing a selenium precursor and a second selenium precursor solvent in a ratio of 0.1~10 mmol:1~20 mL to form the second selenium precursor solution.

In some embodiments, the selenium precursor is selected from one of selenium dioxide, selenium trioxide, selenium powder, sodium selenate, and selenourea.

In some embodiments, the first selenium precursor solvent comprises a phosphine solvent with active electrons.

In some embodiments, the phosphine solvent is selected from one of trioctylphosphine, trioctylphosphine oxide, tributylphosphine, tris(trimethylsilyl)phosphine, tris(dimethylamino)phosphine, diphenylphosphine, diethylphosphine, bis(2-methoxyphenyl)phosphine, and tris(diethylamino)phosphine.

In some embodiments, the second selenium precursor solvent comprises an inert solvent.

In some embodiments, the inert solvent is selected from one of tetradecane, hexadecane, octadecane, eicosane, tetracosane, octadecene, phenyl ether, benzyl ether, liquid paraffin, mineral oil, dodecylamine, hexadecylamine, and octadecylamine.

According to another aspect of the present disclosure, a quantum dot comprising one of ZnSe quantum dot, CdSe quantum dot, and PbSe quantum dot is provided, a wavelength of the fluorescence emission peak of the ZnSe quantum dot is greater than 455 nm and less than or equal to 470 nm.

In some embodiments, the quantum dot is the ZnSe quantum dot with a core-shell structure, and a band gap of the shell of the ZnSe quantum dot is greater than a band gap of the core of the ZnSe quantum dot.

In some embodiments, a material of the shell of the ZnSe quantum dot is at least one selected from a group consisting of ZnS, ZnSeS, MnS, and MnO.

In some embodiments, the material of the shell of the ZnSe quantum dot is ZnS, and the ZnS shell has a thickness of two atomic layers or four atomic layers.

In some embodiments, the ZnS shell of the ZnSe quantum dot has the thickness of four atomic layers, and a fluorescence quantum yield of the ZnSe quantum dot is about 60%.

In some embodiments, the quantum dot is the ZnSe quantum dot, and the ZnSe quantum dot has a particle size ranging from 2.0 nm to 35.2 nm.

According to yet another aspect of the present disclosure, a display device comprising the quantum dot described in any one of the preceding embodiments.

BRIEF DESCRIPTION OF THE DRAWINGS

In order to more clearly describe the technical solutions in the embodiments of the present disclosure, the drawings that need to be used in the embodiments will be briefly introduced in the following. Obviously, the drawings in the following description are only some embodiments of the present disclosure. For those of ordinary skill in the art, other drawings can be obtained based on these drawings without creative work.

FIG. 1A illustrates a flowchart of a method for preparing a quantum dot according to an embodiment of the present disclosure;

DETAILED DESCRIPTION OF THE DISCLOSURE

The technical solutions in the embodiments of the present disclosure will be clearly and completely described below in conjunction with the drawings in the embodiments of the present disclosure. Obviously, the described embodiments are only a part of the embodiments of the present disclosure. Based on the embodiments in the present disclosure, all other embodiments obtained by those of ordinary skill in the art without creative work shall fall within the protection scope of the present disclosure.

FIG. 1A illustrates a flow chart of a method for preparing a quantum dot according to an embodiment of the present disclosure. As illustrated in FIG. 1A, the method 100 comprises the following steps: step S101, providing a first precursor solution, a second precursor solution, a first selenium precursor solution, and a second selenium precursor solution with a lower reaction activity than the first selenium precursor solution; step S102, adding the first selenium precursor solution to the second precursor solution to form an intermediate of the quantum dot; step S103, performing the following step at least once to form the quantum dot: adding the first precursor solution and the second selenium precursor solution to the intermediate of the quantum dot and making them react.

Figure 1B:
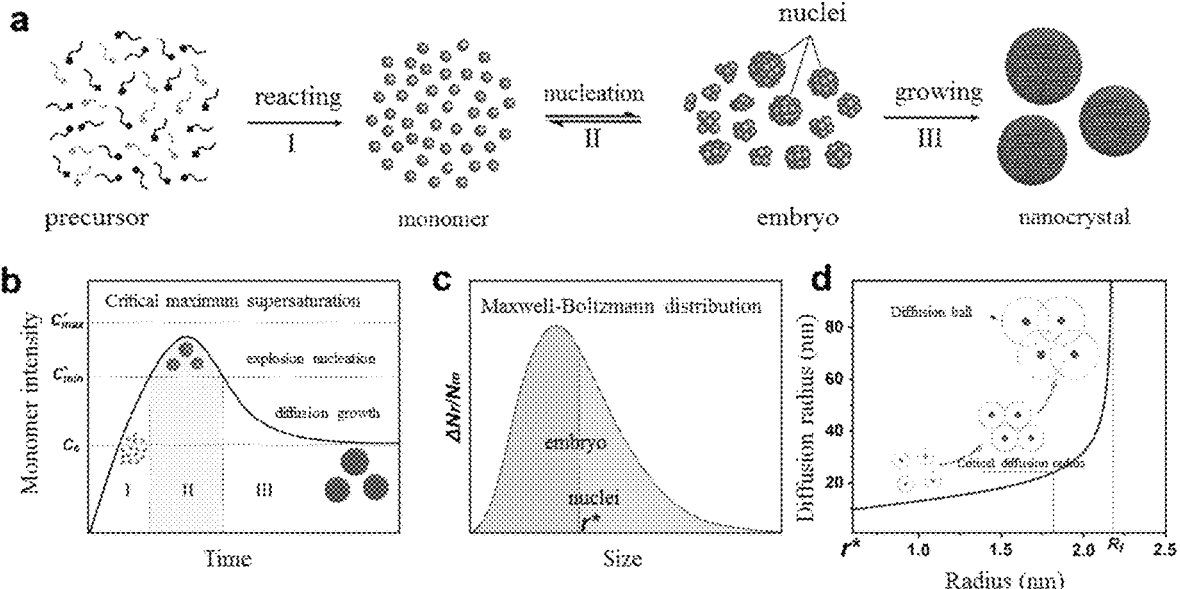
FIG. 1B illustrates a schematic diagram of a formation process of a quantum dot according to an embodiment of the present disclosure.

In order to enable readers to understand the growth process of the intermediate of the quantum dot in step S102 more clearly, FIG. 1B illustrates a schematic diagram of the preparation process and formation mechanism of the intermediate of the quantum dot. Referring to FIG. 1B(a), first in stage I, the first selenium precursor and the second precursor react at high temperature (up to the nucleation temperature) to form a monomer. Then in stage II, monomers collide with each other in the reaction medium and aggregate, that is, the nucleation process. During the nucleation process, embryos of different sizes are generated, and the embryos exceeding the critical nucleation size are called nuclei. Only the nuclei can exist stably, and embryos with a size smaller than the critical nucleation size are unstable and will dissolve or be annexed by larger nuclei. Finally, in stage III, the stable nuclei further grow to form intermediate of the quantum dot, and the process of nuclei growth is controlled by the diffusion of monomers in the reaction solution, so it is also called the diffusion-controlled growth process. FIG. 1B(b) illustrates the classic Lamer nucleation model, and the stages I, II, and III in the figure correspond to stages I, II, and III in FIG. 1B(a), respectively. Referring to FIG. 1B(b), in stage I, the first selenium precursor and the second precursor react to form monomers, and the monomer concentration increases continuously. When the monomer concentration exceeds the critical nucleation concentration ($C_{min}$), it enters the nucleation process of Stage II. Since the nucleation process consumes a large amount of monomer, when the monomer production rate is greater than the consumption rate, the monomer concentration continues to rise, and when the monomer production rate is lower than the consumption rate, the monomer concentration begins to decrease. With the progress of the nucleation process, when the monomer concentration drops below the critical nucleation concentration, the nucleation process ends, and enters the growth process of stage III. No new nuclei are generated during the growth process, that is, the number of nuclei remains unchanged throughout the growth process. FIG. 1B (c) illustrates the size distribution of embryos produced during the nucleation process at stage II. According to thermodynamics, the size of the embryo obeys the Maxwell-Boltzmann distribution. FIG. 1B (d) illustrates the variation curve of the diffusion radius with the quantum dot radius during the diffusion growth process in stage III. It can be seen from the curve that when the diffusion radius reaches the critical diffusion radius of the reaction system, the diffusion radius begins to increase sharply, and the diffusion balls overlap, indicating that there is competition for further growth of the quantum dots, making it more difficult to grow bigger for the quantum dots.

It should be noted that in the embodiments of the present disclosure, terms such as "reaction activity" and "activity" refer to the degree of activity of a chemical reagent or precursor solution in a chemical reaction. The higher the reaction activity or the activity, the easier it is to react. For example, a reactant with high reaction activity refers to a reactant with a higher degree of reactivity, and a reactant with low reaction activity refers to a reactant with a lower degree of reactivity. Therefore, in step S101, the phrase "a second selenium precursor solution with a lower reaction activity than the first selenium precursor solution" means that the reaction activity of the second selenium precursor solution is less than the reaction activity of the first selenium precursor solution. That is, the reaction activity degree of the second selenium precursor solution is lower than the reaction activity degree of the first selenium precursor solution. The terms "reaction activity" and "activity" are used interchangeably herein.

It should also be noted that in the embodiments of the present disclosure, the term "intermediate" refers to the intermediate product(s) of a certain product obtained in the chemical synthesis process. Therefore, in step S102, the phrase "intermediate of quantum dot" refers to the intermediate product(s) of finally formed quantum dot during the chemical synthesis process.

It should be also pointed out that in the above step S101 "providing a first precursor solution, a second precursor solution, a first selenium precursor solution, and a second selenium precursor solution with a lower reaction activity than the first selenium precursor solution", the meaning of the word "providing" comprises, but is not limited to, preparing, purchasing. For example, the applicant can prepare the first precursor solution, the second precursor solution, the first selenium precursor solution, and the second selenium precursor solution by himself, or can prepare the first precursor solution, the second precursor solution, the first selenium precursor solution and the second selenium precursor solution by cooperating with other companies or enterprises, or can purchase the first precursor solution, the second precursor solution, the first selenium precursor solution, and the second selenium precursor solution from other companies or enterprises, or any other suitable approaches may be employed to obtain the first precursor solution, the second precursor solution, the first selenium precursor solution, and the second selenium precursor solution.

It should be noted that, in step S103 "adding the first precursor solution and the second selenium precursor solution to the intermediate of the quantum dot and making them react" may refer to successively adding the first precursor solution and the second selenium precursor solution to the intermediate of the quantum dot and making them react, that is, firstly adding the first precursor solution to the intermediate of the quantum dot, and then adding the second selenium precursor solution to the intermediate of the quantum dot, and making them react; it can also refer to adding the first precursor solution and the second selenium precursor solution to the intermediate of the quantum dot at the same time and making them react.

It should be noted that, in the embodiments of the present disclosure, the first precursor solution and the second precursor solution may be precursor solutions of various appropriate materials. For example, in some embodiments, the first precursor solution may be a first zinc precursor solution, and the second precursor solution may be a second zinc precursor solution, in which case the quantum dot formed by method 100 is ZnSe quantum dot. In alternative embodiments, the first precursor solution may be a first cadmium precursor solution, and the second precursor solution may be a second cadmium precursor solution, in which case the quantum dot formed by the method 100 is CdSe quantum dot. In yet other alternative embodiments, the first precursor solution may be a first lead precursor solution, and the second precursor solution may be a second lead precursor solution, in which case the quantum dot formed by method 100 is PbSe quantum dot. Therefore, the method 100 provided by the embodiments of the present disclosure has universality, and can be used to prepare quantum dots of various suitable materials, rather than being limited to preparing quantum dots of a specific material.

In the method 100, by first adding the first selenium precursor solution with higher reaction activity to the solution to form the intermediate of quantum dot, and then adding the second selenium precursor solution with lower reaction activity than that of the first selenium precursor solution to form the quantum dot, under this sequence of steps, the quantum dot can be formed with the required particle size range and the fluorescence emission peak range. In addition, before adding the first precursor solution and the second selenium precursor solution to the intermediate of the quantum dot, the intermediate of the quantum dot does not need to be cleared, so the waste of the intermediate of the quantum dot due to the cleaning operation can be avoided, the preparation process can be greatly simplified, and the process difficulty can be reduced.

Hereinafter, the steps of the method 100 will be described in detail by taking the first precursor solution being the first zinc precursor solution and the second precursor solution being the second zinc precursor solution (that is, the resulted quantum dot is ZnSe quantum dot, hereinafter referred to as the first ZnSe quantum dot) as an embodiment.

In some embodiments, the material of the solute in the first zinc precursor solution is the same as the material of the solute in the second zinc precursor solution, and the material of the solvent in the first zinc precursor solution is the same as the material of the solvent in the second zinc precursor solution, but the ratio of solute to solvent in the first zinc precursor solution is different from the ratio of solute to solvent in the second zinc precursor solution. The term "solute" as used herein refers to a substance that is dissolved by a solvent in a solution, and the term "solvent" refers to a reagent in which the solute is dispersed. The solute can comprise one or more different substances, and the solvent can also comprise one or more different reagents. "The ratio of solute to solvent in the first zinc precursor solution is different from the ratio of solute to solvent in the second zinc precursor solution" can comprise the following situations: the solute in the first zinc precursor solution has the same material and the same concentration as the solute in the second zinc precursor solution, and the solvent in the first zinc precursor solution has the same material but different concentrations as the solvent in the second zinc precursor solution, in which case the ratio of solute to solvent in the first zinc precursor solution is different from the ratio of solute to solvent in the second zinc precursor solution; the solute in the first zinc precursor solution has the same material but different concentration as the solute in the second zinc precursor solution, and the solvent in the first zinc precursor solution has the same material and same concentration as the solvent in the second zinc precursor solution, in which case the ratio of solute to solvent in the first zinc precursor solution is different from the ratio of solute to solvent in the second zinc precursor solution; the solute in the first zinc precursor solution has the same material but different concentration as the solute in the second zinc precursor solution, and the solvent in the first zinc precursor solution has the same material but different concentration as the solvent in the second zinc precursor solution, in which case the ratio of solute to solvent in the first zinc precursor solution is different from the ratio of solute to solvent in the second zinc precursor solution.

In some embodiments, providing the first precursor solution in step S101 may comprise the following sub-steps: mixing zinc inorganic salt, organic acid, organic amine and inert solvent in a ratio of 1~10 mmol:1~10 mmol:1~10 mL:10~50 mL, stirring the mixture under the protection of inert gas and heating the mixture until clear to form the first zinc precursor solution. It should be noted that the phrase "mixing zinc inorganic salt, organic acid, organic amine and inert solvent in a ratio of 1~10 mmol:1~10 mmol:1~10 mL:10~50 mL" means that in the synthesis process, the actual amount of zinc inorganic salt is 1~10 mmol, the actual amount of organic acid is 1~10 mmol, the actual amount of organic amine is 1~10 mL, and the actual amount of inert solvent is 10~50 mL. Alternatively, it means that in the synthesis process, the actual amount of zinc inorganic salt is $x*(1\sim10 \text{ mmol})$, the actual amount of organic acid is x*(1~10 mmol), the actual amount of organic amine is x*(1~10 mL) and the actual amount of inert solvent is x*(10~50 mL), where x>0. That is, 1~10 mmol:1~10 mmol: 1~10 mL:10~50 mL is not necessarily the ratio of the actual amount of zinc inorganic salt:organic acid:organic amine: inert solvent, and it may be the ratio of their actual amount after taking the common divisor or common multiple. For example, when the value of x is 2, the actual amount of zinc inorganic salt can be 2~20 mmol, the actual amount of organic acid can be 2~20 mmol, the actual amount of organic amine can be 2~20 mL and the actual amount of inert solvent can be 20~100 mL. Whether it is laboratory synthesis or actual large-scale process production, the method and raw materials provided in this step can be satisfied.

In this step, the zinc inorganic salt is referred to as the solute in the first zinc precursor solution, and the organic acid, organic amine and inert solvent are referred to as the solvent in the first zinc precursor solution. The zinc inorganic salt can be selected from one of inorganic salts such as zinc chloride, zinc bromide, zinc iodide, zinc oxide, zinc nitrate, zinc acetate, zinc laurate, zinc myristate, and zinc stearate. The organic acid may be selected from one of organic acids such as valeric acid, stearic acid, oleic acid, palmitic acid, levulinic acid, lactic acid, and 3-hydroxypropionic acid. The organic amine can be selected from one of reagents such as oleylamine, stearylamine, dodecylamine, and octylamine. The inert solvent can be an inert organic solvent with a boiling point higher than 200° C., comprising but not limited to tetradecane, hexadecane, octadecane, eicosane, tetracosane, octadecene, phenyl ether, benzyl ether, liquid paraffin, mineral oil, dodecylamine, hexadecylamine, octadecylamine.

In some embodiments, providing the second precursor solution in step S101 may comprise the following sub-steps: mixing zinc inorganic salt, organic acid, organic amine and inert solvent in a ratio of 0.1~10 mmol:1~10 mL:1~10 mL:1~20 mL, stirring the mixture under the protection of inert gas and heating the mixture to 250° C.~350° C. to form the second zinc precursor solution. Similar to the first zinc precursor solution, the phrase "mixing zinc inorganic salt, organic acid, organic amine and inert solvent in a ratio of 0.1~10 mmol:1~10 mL:1~10 mL:1~20 mL" means that in the synthesis process, the actual amount of zinc inorganic salt is 0.1~10 mmol, the actual amount of organic acid is 1~10 mL, the actual amount of organic amine is 1~10 mL, and the actual amount of inert solvent is 1~20 mL. Alternatively, it means that in the synthesis process, the actual amount of zinc inorganic salt is x*(0.1~10 mmol), the actual amount of organic acid is x*(1~10 mL), the actual amount of organic amine is x*(1~10 mL) and the actual amount of inert solvent is x*(1~20 mL), where x>0. That is, 0.1~10 mmol:1~10 mL:1~10 mL:1~20 mL is not necessarily the ratio of the actual amount of zinc inorganic salt:organic acid:organic amine:inert solvent, and it may be the ratio of their actual amount after taking the common divisor or common multiple. For example, when the value of x is 2, the actual amount of zinc inorganic salt can be 0.2~20 mmol, the actual amount of organic acid can be 2~20 mL, the actual amount of organic amine can be 2~20 mL and the actual amount of inert solvent can be 2~40 mL. Whether it is laboratory synthesis or actual large-scale process production, the method and raw materials provided in this step can be satisfied.

In this step, the zinc inorganic salt is referred to as the solute in the second zinc precursor solution, and the organic acid, organic amine and inert solvent are referred to as the solvent in the second zinc precursor solution. The zinc inorganic salt can be selected from one of inorganic salts such as zinc chloride, zinc bromide, zinc iodide, zinc oxide, zinc nitrate, zinc acetate, zinc laurate, zinc myristate, and zinc stearate. The organic acid may be selected from one of organic acids such as valeric acid, stearic acid, oleic acid, palmitic acid, levulinic acid, lactic acid, and 3-hydroxypropionic acid. The organic amine can be selected from one of reagents such as oleylamine, stearylamine, dodecylamine, and octylamine. The inert solvent can be an inert organic solvent with a boiling point higher than 200° C., comprising but not limited to tetradecane, hexadecane, octadecane, eicosane, tetracosane, octadecene, phenyl ether, benzyl ether, liquid paraffin, mineral oil, dodecylamine, hexadecylamine, octadecylamine. It should be noted that the ratio of zinc inorganic salt, organic acid, organic amine and inert solvent in the second zinc precursor solution is different from the ratio of zinc inorganic salt, organic acid, organic amine and inert solvent in the first zinc precursor solution. Through this ratio control, it is beneficial to make the particle size of the formed ZnSe quantum dot cover all the particle size in the required range, and it is beneficial to make the fluorescence emission peak of the formed ZnSe quantum dot cover all the fluorescence emission peak in the required range.

In some embodiments, providing the first selenium precursor solution in step S101 may comprise the following sub-steps: mixing a selenium precursor and a first selenium precursor solvent in a ratio of 0.1~10 mmol:1~20 mL to form the first selenium precursor solution. The phrase "mixing a selenium precursor and a first selenium precursor solvent in a ratio of 0.1~10 mmol:1~20 mL" means that in the synthesis process, the actual amount of the selenium precursor is 0.1~10 mmol, and the actual amount of the first selenium precursor solvent is 1~20 mL. Or, it means that in the synthesis process, the actual amount of the selenium precursor is x*(0.1~10 mmol), and the actual amount of the first selenium precursor solvent is x*(1~20 mL), where x>0. That is, 0.1~10 mmol:1~20 mL is not necessarily the ratio of the actual amount of the selenium precursor:the first selenium precursor solvent, but may be the ratio of their actual amount after taking the common divisor or common multiple. For example, when the value of x is 2, the actual amount of the selenium precursor can be 0.2~20 mmol, and the actual amount of the first selenium precursor solvent can be 2~40 mL. Whether it is laboratory synthesis or actual large-scale process production, the method and raw materials provided in this step can be satisfied.

In the first selenium precursor solution, the selenium precursor is referred as the solute in the first selenium precursor solution, and the first selenium precursor solvent is referred as the solvent in the first selenium precursor solution. The selenium precursor can be selected from one of selenium dioxide, selenium trioxide, selenium powder, sodium selenate, selenourea, and the like. In this step, the material selection and amount of the selenium precursor have a very critical effect on the growth of large-size blue-emitting ZnSe quantum dot. The first selenium precursor solvent may comprise a phosphine solvent having active electrons. Due to the existence of active electrons, the electron pair on the phosphorus atom in the phosphine solvent can combine with the selenium in the selenium precursor to form a strong coordination bond, thereby forming a phosphine-selenium compound anion precursor with higher reactivity. The phosphine-selenium compound anion precursor easily reacts with metal cations (such as zinc cations). The phosphine solvent can be selected from, for example, one of trioctylphosphine, trioctylphosphine oxide, tributylphosphine, tris(trimethylsilyl)phosphine, tris(dimethylamino)phosphine, diphenylphosphine, diethylphosphine, bis(2-methoxyphenyl)phosphine, tris(diethylamino) phosphine.

In some embodiments, providing the second selenium precursor solution in step S101 may comprise the following sub-steps: mixing a selenium precursor and a second selenium precursor solvent in a ratio of 0.1~10 mmol:1~20 mL to form the second selenium precursor solution. Here, the explanation about "mixing a selenium precursor and a second selenium precursor solvent in a ratio of 0.1~10 mmol:1~20 mL" is the same as the explanation about the first selenium precursor solution, so for the sake of brevity, it is not described again. Whether it is laboratory synthesis or actual large-scale process production, the method and raw materials provided in this step can be satisfied. In the second selenium precursor solution, the selenium precursor is referred as the solute in the second selenium precursor solution, and the second selenium precursor solvent is referred as the solvent in the second selenium precursor solution. The selenium precursor can be selected from one of selenium dioxide, selenium trioxide, selenium powder, sodium selenate, selenourea, and the like. In this step, the material selection and amount of the selenium precursor have a very critical effect on the growth of large-size blue-emitting ZnSe quantum dot. The second selenium precursor solvent may comprise an inert solvent having inactive electrons. After the inert solvent is combined with selenium in the selenium precursor, the activity of selenium can be reduced. The inert solvent can be an inert organic solvent with a boiling point higher than 200° C., comprising but not limited to tetradecane, hexadecane, octadecane, eicosane, tetracosane, octadecene, phenyl ether, benzyl ether, liquid paraffin, mineral oil, dodecylamine, hexadecylamine, octadecylamine.

It should be noted that although the above embodiments describe their respective preparation methods in the order of the first zinc precursor solution, the second zinc precursor solution, the first selenium precursor solution, and the second selenium precursor solution. However, the order of description is only for the convenience of readers to understand the present disclosure, and does not represent their actual preparation order. The actual preparation order of the first zinc precursor solution, the second zinc precursor solution, the first selenium precursor solution, and the second selenium precursor solution can be flexibly selected according to actual process requirements.

In some embodiments, adding the first selenium precursor solution to the second precursor solution to form an intermediate of quantum dot in step S102 may comprise the following sub-steps: quickly injecting the first selenium precursor solution prepared in the above embodiment into the second zinc precursor solution prepared in the above embodiment, and reacting for 1 minute to 3 hours to form the intermediate of blue-emitting first ZnSe quantum dot. The particle size of the intermediate of the first ZnSe quantum dot is in the range of 3~10 nm, and the fluorescence emission peak of the intermediate of the first ZnSe quantum dot is in the range of 400~455 nm. Here, "quickly injecting the first selenium precursor solution prepared in the above embodiment into the second zinc precursor solution prepared in the above embodiment" means that the first selenium precursor solution is injected (for example, dripped, poured) at a certain flow rate into the second zinc precursor solution, instead of adding the second zinc precursor solution to the first selenium precursor solution. Because the second zinc precursor solution usually needs to be kept in a solution state and has reactive activity under high temperature conditions (such as 250° C.~350° C.), while the selenium precursor can be prepared at room temperature. If the second zinc precursor solution is added to the first selenium precursor solution, the desired result of the present disclosure cannot be obtained. "Quickly injecting" can be understood as adding the prepared first selenium precursor solution to the second zinc precursor solution very quickly and in time once the second zinc precursor solution is prepared. That is, the two operations of completing the preparation of the second zinc precursor solution and adding the first selenium precursor solution are as consistent as possible, and no blank time is between these two operations, if possible.

It should be noted that, as mentioned above, in the first selenium precursor solution, the selenium precursor and the first selenium precursor solvent are mixed in a ratio of $x*(0.1~10$ mmol:1~20 mL); in the second zinc precursor solution, zinc inorganic salt, organic acid, organic amine and inert solvent are mixed in the ratio of $x*(0.1~10$ mmol:1~10 mL:1~10 mL:1~20 mL), $x>0$. In the actual synthesis process, the volume ratio of the first selenium precursor solution and the second zinc precursor solution can be roughly in the range of 0.1~20:0.3~40. In an example, the volume of the first selenium precursor solution may be approximately in the range of 0.1~20 mL, and the volume of the second zinc precursor solution may be approximately in the range of 0.3~40 mL. In another example, the volume of the first selenium precursor solution may be approximately in the range of 0.1~20 L, and the volume of the second zinc precursor solution may be approximately in the range of 0.3~40 L. Whether it is laboratory synthesis or actual large-scale process production, the method provided in this step can be satisfied.

In some embodiments, step S103 "performing the following step at least once to form the quantum dot: adding the first precursor solution and the second selenium precursor solution to the intermediate of the quantum dot and making them react" may comprise the following sub-steps: under 250° C.~350° C., sequentially adding the first zinc precursor solution at room temperature and the second selenium precursor solution at room temperature prepared in the above embodiment to the intermediate of the first ZnSe quantum dot prepared in step S102 with a temperature in the range of 250° C.~350° C., and reacting for 1 minute to 2 hours, continuing to grow a cladding layer on the surface of the intermediate of the first ZnSe quantum dot. This sub-step is performed at least once until the first ZnSe quantum dot of the required size is grown. Then, adding excess n-hexane to the above solution to stop the reaction, transferring the above solution to a centrifuge tube, centrifuging at 7000 rpm for about 3 minutes, pouring out the supernatant in the centrifuge tube, and finally obtaining the blue-emitting first ZnSe quantum dot with desired size.

The number of times of performing the above operations can be determined according to factors such as the size of the required first ZnSe quantum dot, the reaction time, the reaction temperature, the amount and ratio of the reactants, and the like, and the number of times of performing the above operations is not limited in this embodiment. For example, the above operation can be performed once, twice, three times, four times or more.

It should be noted that if the first ZnSe quantum dot with the desired size can be obtained by performing the operation of step S103 once, the product prepared in step S102 is the intermediate of the first ZnSe quantum dot, and the product prepared in step S103 is the final product, that is, the final first ZnSe quantum dot with the required size. If the first ZnSe quantum dot with the desired size can be obtained by performing the operation of step S103 N times, the intermediate prepared in step S102 and the products obtained from all N−1 operations before the $N^{th}$ operation are the intermediates of the first ZnSe quantum dot, the product prepared by the $N^{th}$ operation is the final product, that is, the final first ZnSe quantum dot with the required size. For example, the intermediate obtained from the first time to perform the sub-step "under 250° C.~350° C., sequentially adding the first zinc precursor solution at room temperature and the second selenium precursor solution at room temperature to the intermediate of the first ZnSe quantum dot prepared in step S102 with a temperature in the range of 250° C. to 350° C., and reacting for 1 minute to 2 hours" can be called the first intermediate of the first ZnSe quantum dot; the intermediate obtained from the second time to perform the sub-step "under 250° C.~350° C., sequentially adding the first zinc precursor solution at room temperature and the second selenium precursor solution at room temperature to the first intermediate of the first ZnSe quantum dot with a temperature in the range of 250° C. to 350° C., and reacting for 1 minute to 2 hours" can be called the second intermediate of the first ZnSe quantum dot; the intermediate obtained from the $(N-1)^{th}$ time to perform the sub-step "under 250° C.~350° C., sequentially adding the first zinc precursor solution at room temperature and the second selenium precursor solution at room temperature to the $(N-2)^{th}$ intermediate of the first ZnSe quantum dot with a temperature in the range of 250° C. to 350° C., and reacting for 1 minute to 2 hours" can be called the $(N-1)^{th}$ intermediate of the first ZnSe quantum dot; and the final product obtained from the $N^{th}$ time to perform the sub-step "under 250° C.~350° C., sequentially adding the first zinc precursor solution at room temperature and the second selenium precursor solution at room temperature to the $(N-1)^{th}$ intermediate of the first ZnSe quantum dot with a temperature in the range of 250° C. to 350° C., and reacting for 1 minute to 2 hours" can be called the final first ZnSe quantum dot. Here, N can be a positive integer greater than or equal to 3. It should be noted that in the step S103, the respective concentrations of the first zinc precursor solution and the second selenium precursor solution added each time may be the same or different from the previous time. For example, the respective concentrations of the first zinc precursor solution and the second selenium precursor solution added during the $N^{th}$ execution of the sub-step and the respective concentrations of the first zinc precursor solution and the second selenium precursor solution added during the $(N-1)^{th}$ execution of the sub-step may be the same or different. In case of different, the respective concentrations of the first zinc precursor solution and the second selenium precursor solution added during the $N^{th}$ execution of the sub-step may be higher or lower than the respective concentrations of the first zinc precursor solution and the second selenium precursor solution added during the $(N-1)^{th}$ execution of the sub-step, which is not limited in the embodiments of the present disclosure.

It should be noted that step S103 can be performed directly following step S102 without cleaning the intermediate of the first ZnSe quantum dot prepared in step S102. This can avoid the waste of the intermediate of the first ZnSe quantum dot caused by cleaning operation, and can greatly simplify the preparation process and reduce the process difficulty. Therefore, if necessary, step S102 and step S103 can be combined into one step. In this step, the first zinc precursor solution is firstly added to the intermediate of the first ZnSe quantum dot prepared in step S102, and then the second selenium precursor solution is added, this sequence of operations facilitates the growth of the first ZnSe quantum dot with large size.

The particle size range of the first ZnSe quantum dot formed in step S103 comprises the range of 10~15 nm, the fluorescence emission peak is approximately in the range of 455~470 nm, the full width at half maximum (FWHM) of the fluorescence is less than 30 nm, and the fluorescence quantum yield is approximately 21%. The inventors of the present application noticed that the particle sizes of the ZnSe quantum dots reported in the related art are relatively small (for example, less than 10 nm) and the fluorescence emission peaks are all lower than 455 nm. The blue light in this wavelength range (lower than 455 nm) is harmful blue light, which is more harmful to human eyes. However, the particle size of the first ZnSe quantum dot prepared by the method of the embodiments of the present disclosure can reach 10~15 nm, and the fluorescence emission peak can reach 455~470 nm, which is relatively less harmful to human eyes. The first ZnSe quantum dot prepared by the method of the embodiments of the present disclosure has a larger particle size and can emit blue light that is less harmful to human eyes, so it can be widely used in the display field.

It should be noted that although it is described here as "the particle size range of the first ZnSe quantum dot comprises the range of 10~15 nm", as the word "comprises" conveys the open semantics, the particle size range of the first ZnSe quantum dot is not limited to the range of 10~15 nm. For example, in the actual preparation process, the first ZnSe quantum dot with a particle size slightly smaller than 10 nm (for example, 9.9 nm) and a particle size slightly larger than 15 nm (for example, 15.1 nm) can also be prepared. Similarly, "the fluorescence emission peak is approximately in the range of 455~470 nm" described here does not exclude that the first ZnSe quantum dot may also have fluorescence emission peaks in other wavelength ranges. For example, in the actual preparation process, the fluorescence emission peak of the first ZnSe quantum dot can also be slightly smaller than 455 nm (for example, 454 nm) and slightly larger than 470 nm (for example, 471 nm).

Since the first ZnSe quantum dot does not have heavy metal ions with strong toxicity and serious environmental pollution, it is environmentally friendly and pollution-free. In addition, the method has simple reaction system, readily available raw materials, easy operation, and mild conditions, and has great application value whether it is in laboratory synthesis or actual large-scale process production. In addition, the embodiments of the present disclosure form the required first ZnSe quantum dot by first adding the first selenium precursor solution with high reaction activity and then adding the second selenium precursor solution with low reaction activity, and combining the method of multi-step precursor thermal injection. With this method, the first ZnSe quantum dot with a particle size in the range of 3~15 nm can be formed, which solves the technical problem that the particle size of ZnSe quantum dot cannot exceed 10 nm in related art. Since the emission wavelength of ZnSe quantum dot can be controlled by changing the particle size of ZnSe quantum dot, the fluorescence emission peak of the first ZnSe quantum dot prepared by this method can be in the range of 400~470 nm, especially in the range of 455~470 nm, which solves the technical problem that the fluorescence emission peak of ZnSe quantum dot cannot exceed 455 nm in related art, and helps reduce or even avoids harm of harmful blue light (wavelength in the range of 400~450 nm) to human eyes. In addition, the full width at half maximum of the fluorescence of the first ZnSe quantum dot prepared by this method is less than 30 nm, so the fluorescence emission spectrum emitted by the first ZnSe quantum dot has better color purity and color saturation. The first ZnSe quantum dot prepared by the method has good stability to water, oxygen, etc., and can be widely used in the display field. Furthermore, continuing to clad the blue-emitting first ZnSe quantum dot is expected to produce blue-emitting ZnSe quantum dot with higher fluorescence quantum yield, which will greatly promote the application process of ZnSe system materials in the display field.

In the following, a specific example will be used to describe the preparation method of the first ZnSe quantum dot.

Step S101, preparing a first zinc precursor solution, a second zinc precursor solution, a first selenium precursor solution, and a second selenium precursor solution with a lower reaction activity than the first selenium precursor solution.

Preparation of the first zinc precursor solution: weigh 4 mmol zinc acetate, 2 mmol oleic acid, 4 mL oleylamine and 20 mL octadecene and mix them. Stir the mixture under the protection of inert gas and heat the mixture to obtain the first zinc precursor solution.

Preparation of the second zinc precursor solution: weigh 1 mmol zinc acetate, 2 mL oleic acid, 2 mL oleylamine, and 10 mL octadecene and mix them. Stir the mixture under the protection of inert gas and heat the mixture to 280° C. to obtain the second zinc precursor solution.

Preparation of the first selenium precursor solution: weigh 1 mmol selenium powder and 2 mL diphenylphosphine and mix them to obtain the first selenium precursor solution.

Preparation of the second selenium precursor solution: weigh 4 mmol selenium powder and 20 mL octadecene and mix them to obtain the second selenium precursor solution.

It should be noted that although the above examples describe their respective preparation methods in the order of the first zinc precursor solution, the second zinc precursor solution, the first selenium precursor solution, and the second selenium precursor solution, the order of description is only to facilitate readers to understand the present disclosure, it does not represent their actual preparation order. The actual preparation sequence of the first zinc precursor solution, the second zinc precursor solution, the first selenium precursor solution, and the second selenium precursor solution can be flexibly selected according to actual process requirements.

Step S102, adding the first selenium precursor solution to the second zinc precursor solution to form an intermediate of the first ZnSe quantum dot.

Figure 2:
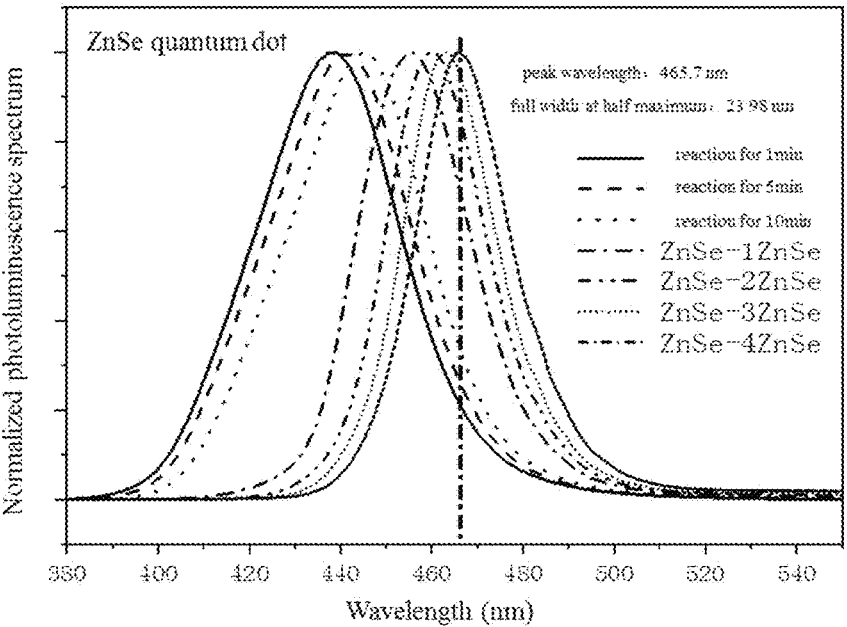
FIG. 2 illustrates the fluorescence spectra emitted at different stages by an intermediate of a first ZnSe quantum dot and the first ZnSe quantum dot which are formed according to the method of FIG. 1A.
Figure 3:
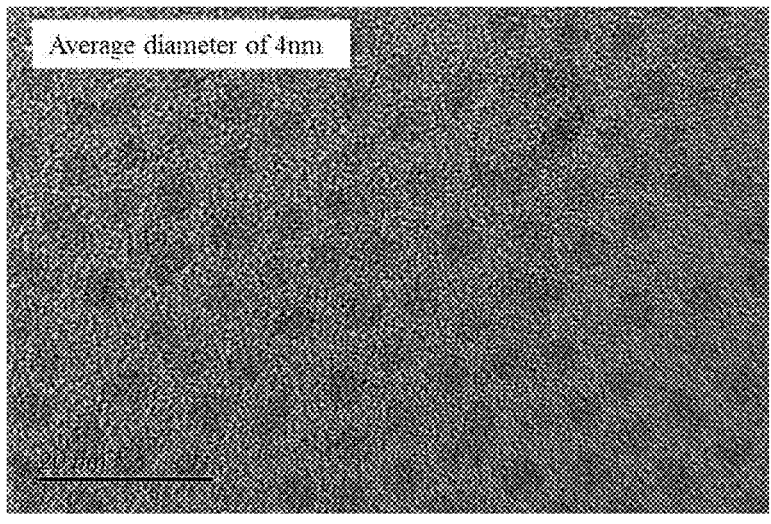
FIG. 3 illustrates a transmission electron microscope image of an intermediate of a first ZnSe quantum dot prepared according to an embodiment of the present disclosure.

The first selenium precursor solution prepared above is quickly injected into the second zinc precursor solution, reacting for 30 minutes to obtain the intermediate of blue-emitting first ZnSe quantum dot with high quantum yield. FIG. 2 illustrates the fluorescence spectra of intermediates of the first ZnSe quantum dot under different reaction times. FIG. 2 illustrates seven fluorescence emission spectra, among them, in the direction from short wavelength to long wavelength along the abscissa, that is, from left to right, the three leftmost fluorescence emission spectra correspond to the fluorescence emission spectra of intermediates of the first ZnSe quantum dot with the reaction time of 1 minute, 5 minutes, and 10 minutes, respectively. It can be seen from FIG. 2 that as the reaction time gradually increases, the peak wavelength of the fluorescence emission spectrum of the intermediates of the first ZnSe quantum dot also gradually increases (that is, gradually shifts towards right). FIG. 3 illustrates a transmission electron microscope (TEM) image of the reaction system at the reaction time of 20 minutes. As illustrated in FIG. 3, the average diameter of the intermediates of the first ZnSe quantum dot is 4 nm when the reaction time is 20 minutes.

Step S103, performing the following step at least once to form the first ZnSe quantum dot: adding the first zinc precursor solution and the second selenium precursor solution to the intermediate of the first ZnSe quantum dot and making them react.

There is no need to clean the intermediate of the first ZnSe quantum dot prepared in step S102, ZnSe continually grows directly on the intermediate of the first ZnSe quantum dot. Under 300° C., firstly adding the first zinc precursor solution at room temperature to the intermediate of the first ZnSe quantum dot prepared in step S102, then adding the second selenium precursor solution at room temperature, mixing them and reacting for 15 minutes, the continuous growth is conducted on the intermediate of the first ZnSe quantum dot. Perform the above operation four times, then add excess n-hexane to the above solution to stop the reaction, and transfer the above solution to a centrifuge tube. After centrifugation at 7000 rpm for about 3 minutes, pour out the supernatant in the centrifuge tube, finally, blue-emitting first ZnSe quantum dots with the required size are obtained. The fluorescence quantum yield of the first ZnSe quantum dots prepared by the above method is about 21%.

It should be noted that the phrase "perform the above operation four times" specifically refers to: under 300° C., adding the first zinc precursor solution to the intermediate of the first ZnSe quantum dot prepared in step S102 and then adding the second zinc precursor solution for the first time, reacting for 15 minutes to continue to grow on the outside of the intermediate of the first ZnSe quantum dot, and the particle size of the obtained first ZnSe quantum dot is increased compared with the particle size of the first ZnSe quantum dot in step S102. Then, under 300° C., adding the first zinc precursor solution at room temperature to the first ZnSe quantum dot obtained above and then adding the second selenium precursor solution at room temperature for the second time, and reacting for 15 minutes to make the first ZnSe quantum dot continue to grow, and the particle size of the obtained first ZnSe quantum dot is increased compared with the particle size of the first ZnSe quantum dot when the first zinc precursor solution and the second selenium precursor solution are added for the first time. Then, under 300° C., adding the first zinc precursor solution at room temperature to the first ZnSe quantum dot obtained above and then adding the second selenium precursor solution at room temperature for the third time, and reacting for 15 minutes to make the first ZnSe quantum dot continue to grow, and the particle size of the obtained first ZnSe quantum dot is increased compared with the particle size of the first ZnSe quantum dot when the first zinc precursor solution and the second selenium precursor solution are added for the second time. Finally, under 300° C., adding the first zinc precursor solution at room temperature to the first ZnSe quantum dot obtained above and then adding the second selenium precursor solution at room temperature for the fourth time, and reacting for 15 minutes to make the first ZnSe quantum dot continue to grow, and the particle size of the obtained first ZnSe quantum dot is increased compared with the particle size of the first ZnSe quantum dot when the first zinc precursor solution and the second selenium precursor solution are added for the third time. Thus, the first ZnSe quantum dot with desired particle size and peak emission wavelength is obtained.

In this step, the first zinc precursor solution is added first, and then the second selenium precursor solution is added. This sequence of operation is conducive to the growth of the first ZnSe quantum dot with large size.

Referring to FIG. 2, along the direction from short wavelength to long wavelength of the abscissa, that is, from left to right, the four fluorescence emission spectra on the rightmost in FIG. 2 respectively correspond to the fluorescence emission spectrum (corresponding to the curve ZnSe-1ZnSe in FIG. 2) of one operation (that is, adding the first zinc precursor solution and then the second selenium precursor solution, and reacting for 15 minutes), the fluorescence emission spectrum (corresponding to the curve ZnSe-2ZnSe in FIG. 2) of two operations (that is, adding the first zinc precursor solution and then the second selenium precursor solution, reacting for 15 minutes; then adding the first zinc precursor solution and then the second selenium precursor solution, reacting for 15 minutes), the fluorescence emission spectrum (corresponding to the curve ZnSe-3ZnSe in FIG. 2) of three operations (that is, adding the first zinc precursor solution and then the second selenium precursor solution, reacting for 15 minutes; then adding the first zinc precursor solution and then the second selenium precursor solution, reacting for 15 minutes; then adding the first zinc precursor solution and then the second selenium precursor solution, reacting for 15 minutes), and the fluorescence emission spectrum (corresponding to the curve ZnSe-4ZnSe in FIG. 2) of four operations (that is, adding the first zinc precursor solution and then the second selenium precursor solution, reacting for 15 minutes; then adding the first zinc precursor solution and then the second selenium precursor solution, reacting for 15 minutes; then adding the first zinc precursor solution and then the second selenium precursor solution, reacting for 15 minutes; then adding the first zinc precursor solution and then the second selenium precursor solution, reacting for 15 minutes). As illustrated in FIG. 2, the fluorescence emission peak of the fluorescence emission spectrum ZnSe-1ZnSe is about 455 nm, and the fluorescence emission peak of the fluorescence emission spectrum ZnSe-4ZnSe is about 465.7 nm. The full width at half maximum of the fluorescence is 23.98 nm.

Figure 4:
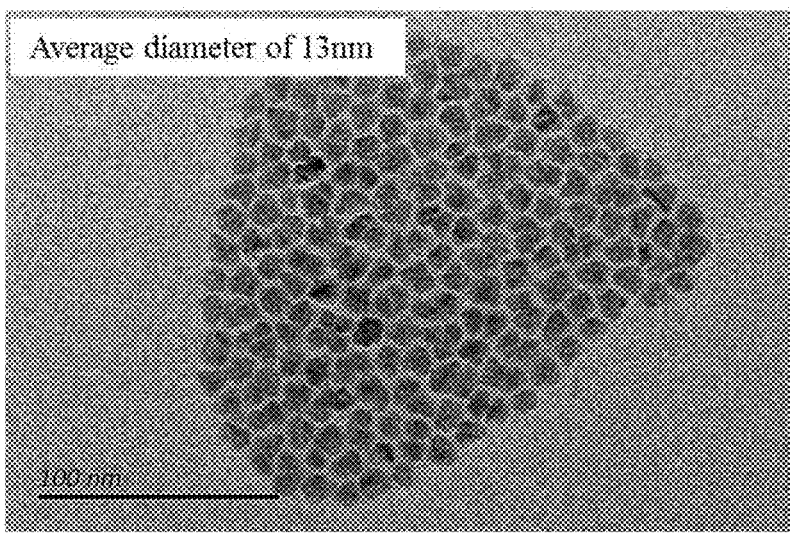
FIG. 4 illustrates a transmission electron microscope image of a first ZnSe quantum dot prepared according to an embodiment of the present disclosure.

FIG. 4 illustrates a transmission electron microscope image of the first ZnSe quantum dots formed in step S103. As illustrated in FIG. 4, the average diameter of the first ZnSe quantum dots is about 13 nm.

Figure 5:
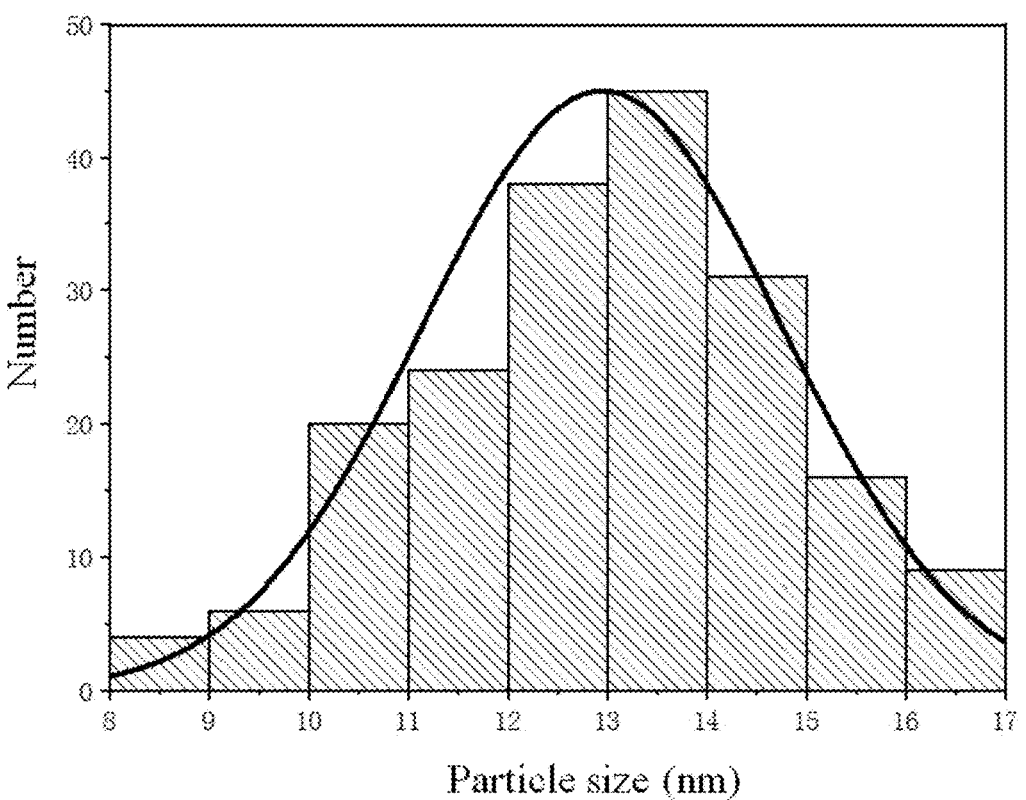
FIG. 5 illustrates a size distribution diagram of the first ZnSe quantum dot prepared according to an embodiment of the present disclosure.

FIG. 5 illustrates the size distribution diagram of the first ZnSe quantum dots formed in step S103. The size distribution diagram illustrated in FIG. 5 counts a total of 193 first ZnSe quantum dots. The average diameter of the 193 first ZnSe quantum dots is 12.95 nm, the standard deviation is 1.80 nm, and the minimum diameter is 8.1 nm and the maximum diameter is 16.7 nm.

Figure 6:
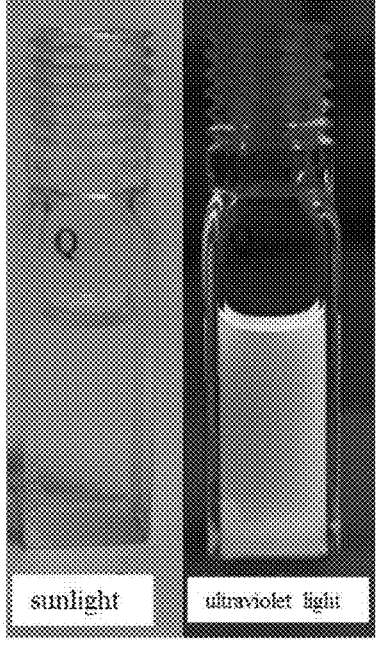
FIG. 6 illustrates a comparison diagram of the first ZnSe quantum dot prepared according to an embodiment of the present disclosure under sunlight and ultraviolet light.

FIG. 6 illustrates a comparison diagram of the first ZnSe quantum dots formed in step S103 under sunlight (left) and ultraviolet light (right). Although it seems that the color of the first ZnSe quantum dots under sunlight and the color of the first ZnSe quantum dots under ultraviolet light cannot be seen intuitively from this picture due to the grayscale processing of the picture, the picture can intuitively shows the difference in color between the two. In the actual experimental measurement results, the first ZnSe quantum dots under sunlight irradiation appear light green, and the first ZnSe quantum dots under ultraviolet light irradiation appear blue. That is, under ultraviolet light irradiation, the first ZnSe quantum dots can achieve blue light emission with an emission band between 455 and 470 nm and a high luminous intensity.

The preparation method provided in this example has basically the same technical effect as the preparation method described in the previous embodiments. Therefore, for the sake of brevity, the technical effect will not be repeated here.

Figure 7:
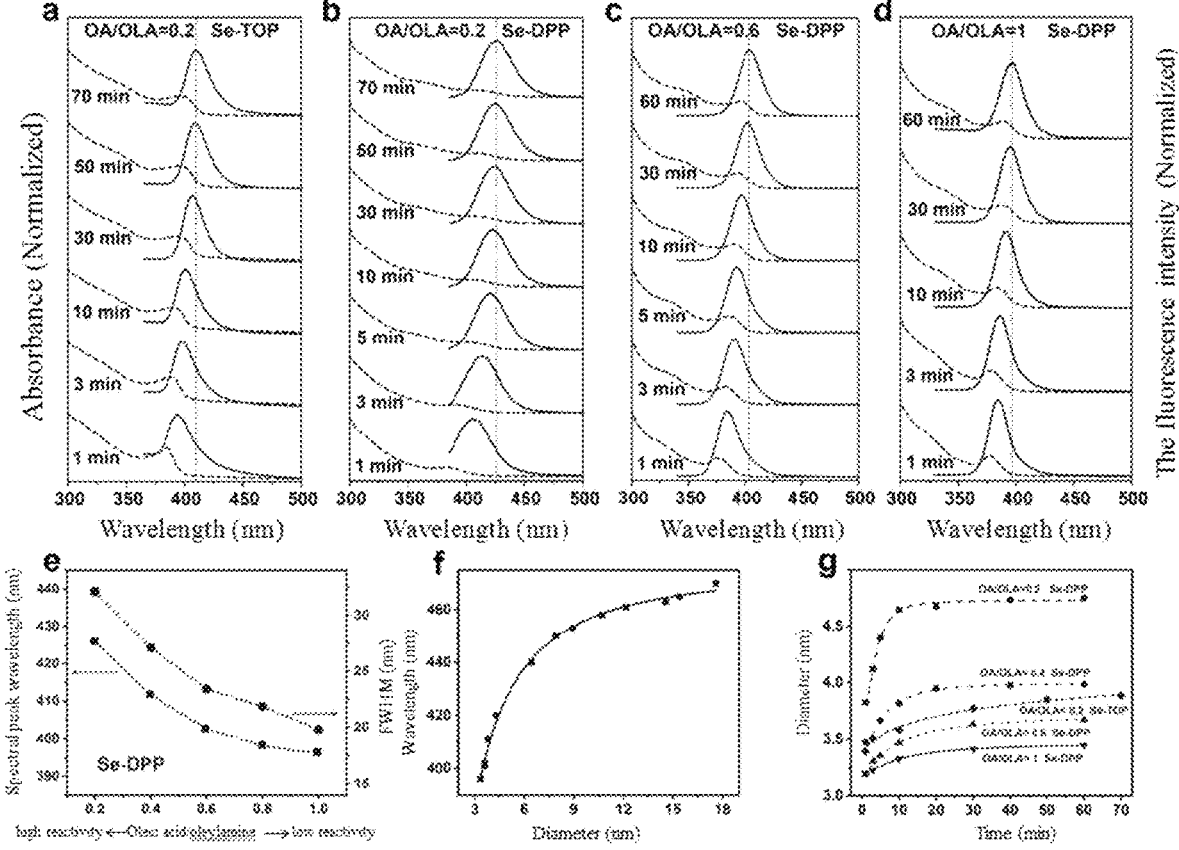
FIG. 7 illustrates (a~d) the absorption and fluorescence spectra of intermediates of the first ZnSe quantum dot under different reaction conditions and reaction times; (e) the variation trend of the peak wavelength of the emission spectrum and full width at half maximum of the intermediate of the first ZnSe quantum dot with the ratio of oleic acid and oleylamine; (f) the fitting curve of the peak wavelength of the emission spectrum of the first ZnSe quantum dots with different particle sizes; and (g) the variation trend of particle size with reaction time of the intermediates of the first ZnSe quantum dots under different reaction conditions.

FIG. 7 illustrates characteristic curves of the intermediates of the first ZnSe quantum dot or the first ZnSe quantum dot prepared under different reaction conditions and different reaction times.

FIG. 7a illustrates the absorption spectra and fluorescence emission spectra of the intermediate of the first ZnSe quantum dot prepared by step S102 under different reaction times. The specific conditions of step S102 corresponding to FIG. 7a are as follows: raising the temperature of the second zinc precursor solution (0.4 mmol of zinc acetate, 0.2 mL of oleic acid (referred to as OA), 1 mL of oleylamine (referred to as OLA), 10 mL of octadecene (referred to as ODE)) to 280° C., and rapidly injecting the first selenium precursor solution Se-TOP (0.2 mmol selenium powder dissolved in 0.5 mL tri-n-octylphosphine (referred as TOP)) into the second zinc precursor solution to form the intermediate of the first ZnSe quantum dot. That is, in FIG. 7a, the volume ratio (or molar ratio) of OA to OLA is 0.2, and the first selenium precursor solution is Se-TOP. FIG. 7a illustrates 6 sets of absorption spectra (shown by dotted lines) and fluorescence emission spectra (shown by solid lines), and the corresponding reaction times of these 6 sets of absorption spectra and fluorescence emission spectra are 1 minute, 3 minutes, 10 minutes, 30 minutes, 50 minutes, 70 minutes. It can be seen from FIG. 7a that when the reaction time is within 30 minutes, the peak wavelengths of the absorption spectra and fluorescence emission spectra of the intermediate of the first ZnSe quantum dot gradually increase (i.e., gradually shift towards right) with the increase of reaction time. When the reaction time exceeds 30 minutes, the peak wavelengths of the absorption spectra and fluorescence emission spectra of the intermediate of the first ZnSe quantum dot almost no longer move, indicating that the precursor is basically consumed and the reaction is approaching the end point.

FIG. 7b illustrates the absorption spectra and fluorescence emission spectra of the intermediate of the first ZnSe quantum dot prepared by step S102 under different reaction times. The specific conditions of step S102 corresponding to FIG. 7b are as follows: raising the temperature of the second zinc precursor solution (0.4 mmol of zinc acetate, 0.2 mL of oleic acid, 1 mL of oleylamine, 10 mL of octadecene) to 280° C., and rapidly injecting the first selenium precursor solution Se-DPP (0.2 mmol selenium powder dissolved in 0.5 mL diphenylphosphine (referred as DPP)) into the second zinc precursor solution to form the intermediate of the first ZnSe quantum dot. That is, in FIG. 7b, the volume ratio of OA to OLA is 0.2, and the first selenium precursor solution is Se-DPP. FIG. 7b illustrates 7 sets of absorption spectra (shown by dotted lines) and fluorescence emission spectra (shown by solid lines), and the corresponding reaction times of these 7 sets of absorption spectra and fluorescence emission spectra are 1 minute, 3 minutes, 5 minutes, 10 minutes, 30 minutes, 50 minutes, 70 minutes. It can be seen from FIG. 7b that when the reaction time is within 30 minutes, the peak wavelengths of the absorption spectra and fluorescence emission spectra of the intermediate of the first ZnSe quantum dot gradually increase (i.e., gradually shift towards right) with the increase of the reaction time. When the reaction time exceeds 30 minutes, the peak wavelengths of the absorption spectra and fluorescence emission spectra of the intermediate of the first ZnSe quantum dot almost no longer move, indicating that the precursor is basically consumed and the reaction is approaching the end point.

FIG. 7c illustrates the absorption spectra and fluorescence emission spectra of the intermediate of the first ZnSe quantum dot prepared by step S102 under different reaction times. The specific conditions of step S102 corresponding to FIG. 7c are as follows: raising the temperature of the second zinc precursor solution (0.4 mmol of zinc acetate, 0.6 mL of oleic acid, 1 mL of oleylamine, 10 mL of octadecene) to 280° C., and rapidly injecting the first selenium precursor solution Se-DPP (0.2 mmol selenium powder dissolved in 0.5 mL diphenylphosphine) into the second zinc precursor solution to form the intermediate of the first ZnSe quantum dot. That is, in FIG. 7c, the volume ratio of OA to OLA is 0.6, and the first selenium precursor solution is Se-DPP. FIG. 7c illustrates 6 sets of absorption spectra (shown with dotted lines) and fluorescence emission spectra (shown with solid lines), and the corresponding reaction times of these 6 sets of absorption spectra and fluorescence emission spectra are 1 minute, 3 minutes, 5 minutes, 10 minutes, 30 minutes, 60 minutes. It can be seen from FIG. 7c that when the reaction time is within 30 minutes, the peak wavelengths of the absorption spectra and fluorescence emission spectra of the intermediate of the first ZnSe quantum dot gradually increase (i.e., gradually shift towards right) with the increase of the reaction time. When the reaction time exceeds 30 minutes, the peak wavelengths of the absorption spectra and fluorescence emission spectra of the intermediate of the first ZnSe quantum dot almost no longer move, indicating that the precursor is basically consumed and the reaction is approaching the end point.

FIG. 7d illustrates the absorption spectra and fluorescence emission spectra of the intermediate of the first ZnSe quantum dot prepared by step S102 under different reaction times. The specific conditions of step S102 corresponding to FIG. 7d are as follows: raising the temperature of the second zinc precursor solution (0.4 mmol of zinc acetate, 1 mL of oleic acid, 1 mL of oleylamine, 10 mL of octadecene) to 280° C., and rapidly injecting the first selenium precursor solution Se-DPP (0.2 mmol selenium powder dissolved in 0.5 mL diphenylphosphine) into the second zinc precursor solution to form the intermediate of the first ZnSe quantum dot. That is, in FIG. 7d, the volume ratio of OA to OLA is 1, and the first selenium precursor solution is Se-DPP. FIG. 7d illustrates 5 sets of absorption spectra (shown by dashed lines) and fluorescence emission spectra (shown by solid lines), and the corresponding reaction times of these 5 sets of absorption spectra and fluorescence emission spectra are 1 minute, 3 minutes, 10 minutes, 30 minutes, 60 minutes. It can be seen from FIG. 7d that when the reaction time is within 30 minutes, the peak wavelengths of the absorption spectra and fluorescence emission spectra of the intermediate of the first ZnSe quantum dot gradually increase (i.e., gradually shift towards right) with the increase of the reaction time. When the reaction time exceeds 30 minutes, the peak wavelengths of the absorption spectra and fluorescence emission spectra of the intermediate of the first ZnSe quantum dot almost no longer move, indicating that the precursor is basically consumed and the reaction is approaching the end point.

FIG. 7e illustrates the variation trend of the peak wavelength of the fluorescence emission spectrum (dashed line marked with black squares) and full width at half maximum (dashed line marked with black circles) of the intermediate of the first ZnSe quantum dot with the volume ratio of oleic acid to oleylamine. The conditions of step S102 corresponding to FIG. 7e are as follows: the volume ratio of oleic acid to oleylamine in the second zinc precursor solution is between 0.2 and 1.0, rapidly injecting the first selenium precursor solution Se-DPP (0.2 mmol selenium powder dissolved in 0.5 mL diphenylphosphine) into the second zinc precursor solution, mixing them and reacting for 60 minutes at 280° C. (the precursor is consumed) to form the intermediate of the first ZnSe quantum dot. It can see in FIG. 7e the peak values of the fluorescence emission spectra and the values of the full width at half maximum of the corresponding intermediate of the ZnSe quantum dot when the volume ratio of oleic acid to oleylamine is 0.2, 0.4, 0.6, 0.8, and 1.0, respectively. It can be seen that when the volume ratio of oleic acid to oleylamine is between 0.2 and 1.0, the higher the ratio of oleic acid, the lower the reactivity of the second zinc precursor solution, the peak of the fluorescence emission wavelength of the intermediate of the first ZnSe quantum dot obtained at the end of the reaction is smaller. When the volume ratio of oleic acid to oleylamine is 0.2, the reactivity of the second zinc precursor solution is the highest; when the volume ratio of oleic acid to oleylamine is 1.0, the reactivity of the second zinc precursor solution is the lowest.

FIG. 7f illustrates the fitting curve of the peak wavelengths of the fluorescence emission spectra corresponding to the first ZnSe quantum dots with different particle sizes (comprising the intermediate of the first ZnSe quantum dot obtained by step S102 and the first ZnSe quantum dot obtained by step S103) obtained according to the experimental results. It can be seen from FIG. 7f that with the increase of particle size, the peak wavelength of the fluorescence emission spectrum of the first ZnSe quantum dots also gradually increases (that is, gradually shifts towards right). When the particle size exceeds 9 nm, the variation in the peak wavelength of the fluorescence emission spectrum of the first ZnSe quantum dots keeps getting smaller.

FIG. 7g illustrates the variation trend of the particle size of the intermediates of the first ZnSe quantum dot with reaction time under different reaction conditions obtained according to the fitting relationship in FIG. 7f. FIG. 7g illustrates 5 curves, the reaction conditions of step S102 corresponding to these 5 curves are respectively: the volume ratio of oleic acid to oleylamine in the second zinc precursor solution is OA/OLA=0.2, the first selenium precursor solution is Se-DPP; the volume ratio of oleic acid to oleylamine in the second zinc precursor solution is OA/OLA=0.4, the first selenium precursor solution is Se-DPP; the volume ratio of oleic acid to oleylamine in the second zinc precursor solution is OA/OLA=0.2, the first selenium precursor solution is Se-TOP; the volume ratio of oleic acid to oleylamine in the second zinc precursor solution is OA/OLA=0.6, the first selenium precursor solution is Se-DPP; the volume ratio of oleic acid to oleylamine in the second zinc precursor solution is OA/OLA=1, the first selenium precursor solution is Se-DPP. It can be seen from FIG. 7g that when the volume ratio of oleic acid to oleylamine in the second zinc precursor solution is 0.2 (the reactivity of the second zinc precursor solution is the highest), the particle size of the intermediate of the first ZnSe quantum dot obtained by the reaction of the first selenium precursor solution Se-DPP and the second zinc precursor solution is the largest, about 4.7 nm. When the volume ratio of oleic acid to oleylamine in the second zinc precursor solution is 1.0 (the reactivity of the second zinc precursor solution is the lowest), the particle size of the intermediate of the first ZnSe quantum dot obtained by the reaction of the first selenium precursor solution Se-DPP and the second zinc precursor solution is the smallest, about 3.3 nm. In one example, the volume ratio of oleic acid to oleylamine in the first zinc precursor solution may be 0.5~2.0, within this range, the smaller the value, the higher the reactivity of the first zinc precursor solution. That is, the reactivity of the first zinc precursor solution when the volume ratio of oleic acid to oleylamine is 0.5 is higher than the reactivity of the first zinc precursor solution when the volume ratio of oleic acid to oleylamine is 2.0.

Figure 8:
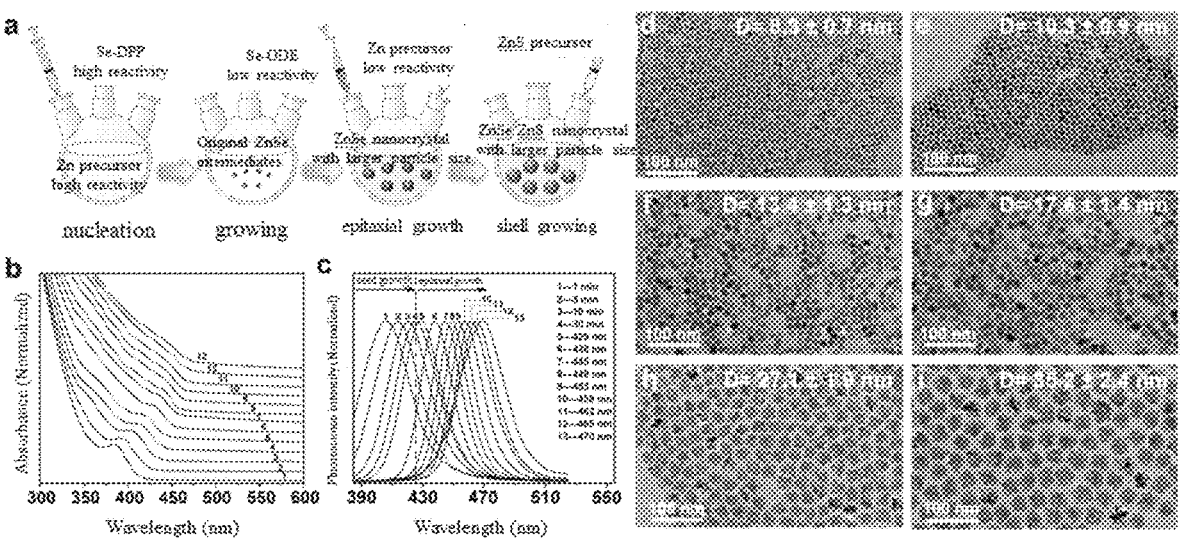
FIG. 8 illustrates (a) a schematic diagram of the preparation process of the first ZnSe quantum dots; (b) an absorption spectra of the first ZnSe quantum dots with different particle sizes; (c) an emission spectra of the first ZnSe quantum dots with different particle sizes; and (d~i) transmission electron microscope images of the first ZnSe quantum dots with different particle sizes.

FIG. 8*a* illustrates the preparation process of the intermediate of the first ZnSe quantum dot and the first ZnSe quantum dot in a more vivid manner. First, the first selenium precursor solution Se-DPP with high reactivity is added to the second zinc precursor solution with high reactivity, after nucleation process and growth process, the intermediate of the first ZnSe quantum dot is formed; then without cleaning the intermediates of the first ZnSe quantum dot, directly add the first zinc precursor solution with low reactivity and the second selenium precursor solution Se-ODE with low reactivity (the two can be added sequentially as described above or simultaneously) into the intermediate of the first ZnSe quantum dot, after epitaxial growth, the first ZnSe quantum dot with larger particle size is formed. Optionally, a Zn—S shell layer may also be cladded on the outer surface of the first ZnSe quantum dot to further increase the particle size of the first ZnSe quantum dot and improve the fluorescence quantum yield of the first ZnSe quantum dot. The shell growing of the first ZnSe quantum dot will be described in detail later.

FIG. 8*b* illustrates the absorption spectra corresponding to the first ZnSe quantum dots with different particle sizes (comprising the intermediates of the first ZnSe quantum dot obtained by step S102 and the first ZnSe quantum dots obtained by step S103), and FIG. 8*c* illustrates the fluorescence emission spectra corresponding to the first ZnSe quantum dots with different particle sizes (comprising the intermediates of the first ZnSe quantum dot obtained by step S102 and the first ZnSe quantum dots obtained by step S103). It can be seen that FIGS. 8*b* and 8*c* respectively show 13 curves, and the curves are marked with numbers 1 to 13 respectively. In FIGS. 8*b* and 8*c*, the curves with the same number represent the absorption spectrum and the fluorescence emission spectrum of the intermediate of the same first ZnSe quantum dot (or the same first ZnSe quantum dot). For example, the curve numbered 1 in FIG. 8*b* represents the absorption spectrum of the intermediate of the first ZnSe quantum dot, and the curve numbered 1 in FIG. 8*c* represents the fluorescence emission spectrum of said intermediate of the first ZnSe quantum dot.

In FIG. 8*b* and FIG. 8*c*, the curves numbered 1 to 4 respectively correspond to the intermediates of the first ZnSe quantum dot prepared by different reaction times in step S102 (that is, the intermediates of the first ZnSe quantum dot prepared by step S101 and step S102); the curves numbered 5 to 13 respectively correspond to the first ZnSe quantum dots prepared by performing different repetition times in step S103 (that is, the first ZnSe quantum dots prepared by steps S101 to S103). Below, the preparation conditions corresponding to the 13 curves are briefly described.

Curve 1: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 1 minute to form an intermediate of the first ZnSe quantum dot.

Curve 2: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 3 minutes to form an intermediate of the first ZnSe quantum dot.

Curve 3: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 10 minutes to form an intermediate of the first ZnSe quantum dot.

Curve 4: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 30 minutes to form an intermediate of the first ZnSe quantum dot.

Curve 5: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 30 minutes to form an intermediate of the first ZnSe quantum dot; step S103, without cleaning the intermediate of the first ZnSe quantum dot, adding the first zinc precursor solution and the second selenium precursor solution to the intermediate of the first ZnSe quantum dot and making them react, to form the first ZnSe quantum dot with a fluorescence emission peak of 429 nm.

Curve 6: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 30 minutes to form an intermediate of the first ZnSe quantum dot; step S103, without cleaning the intermediate of the first ZnSe quantum dot, adding the first zinc precursor solution and the second selenium precursor solution to the intermediate of the first ZnSe quantum dot and making them react, and repeating the step S103 once to form the first ZnSe quantum dot with a fluorescence emission peak of 438 nm.

Curve 7: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 30 minutes to form an intermediate of the first ZnSe quantum dot; step S103, without cleaning the intermediate of the first ZnSe quantum dot, adding the first zinc precursor solution and the second selenium precursor solution to the intermediate of the first ZnSe quantum dot and making them react, and repeating the step S103 four times to form the first ZnSe quantum dot with a fluorescence emission peak of 445 nm.

Curve 8: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 30 minutes to form an intermediate of the first ZnSe quantum dot; step S103, without cleaning the intermediate of the first ZnSe quantum dot, adding the first zinc precursor solution and the second selenium precursor solution to the intermediate of the first ZnSe quantum dot and making them react, and repeating the step S103 six times to form the first ZnSe quantum dot with a fluorescence emission peak of 449 nm.

Curve 9: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 30 minutes to form an intermediate of the first ZnSe quantum dot; step S103, without cleaning the intermediate of the first ZnSe quantum dot, adding the first zinc precursor solution and the second selenium precursor solution to the intermediate of the first ZnSe quantum dot and making them react, and repeating the step S103 eight times to form the first ZnSe quantum dot with a fluorescence emission peak of 453 nm.

Curve 10: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 30 minutes to form an intermediate of the first ZnSe quantum dot; step S103, without cleaning the intermediate of the first ZnSe quantum dot, adding the first zinc precursor solution and the second selenium precursor solution to the intermediate of the first ZnSe quantum dot and making them react, and repeating the step S103 ten times to form the first ZnSe quantum dot with a fluorescence emission peak of 458 nm.

Curve 11: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 30 minutes to form an intermediate of the first ZnSe quantum dot; step S103, without cleaning the intermediate of the first ZnSe quantum dot, adding the first zinc precursor solution and the second selenium precursor solution to the intermediate of the first ZnSe quantum dot and making them react, and repeating the step S103 twelve times to form the first ZnSe quantum dot with a fluorescence emission peak of 462 nm.

Curve 12: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 30 minutes to form an intermediate of the first ZnSe quantum dot; step S103, without cleaning the intermediate of the first ZnSe quantum dot, adding the first zinc precursor solution and the second selenium precursor solution to the intermediate of the first ZnSe quantum dot and making them react, and repeating the step S103 fourteen times to form the first ZnSe quantum dot with a fluorescence emission peak of 465 nm.

Curve 13: step S101, preparing 0.4 mmol first zinc precursor solution, 0.4 mmol second zinc precursor solution, 0.2 mmol first selenium precursor solution and 0.2 mmol second selenium precursor solution; step S102, adding the first selenium precursor solution to the second zinc precursor solution, and reacting for 30 minutes to form an intermediate of the first ZnSe quantum dot; step S103, without cleaning the intermediate of the first ZnSe quantum dot, adding the first zinc precursor solution and the second selenium precursor solution to the intermediate of the first ZnSe quantum dot and making them react, and repeating the step S103 seventeen times to form the first ZnSe quantum dot with a fluorescence emission peak of 470 nm.

FIG. 8d is a transmission electron microscope image of the first ZnSe quantum dots obtained by performing step S103 six times. The average particle size of the first ZnSe quantum dots is 8.3 nm, and the standard deviation is 0.7 nm. FIG. 8e is a transmission electron microscope image of the first ZnSe quantum dots obtained by performing step S103 eight times. The average particle size of the first ZnSe quantum dots is 10.3 nm, and the standard deviation is 0.9 nm. FIG. 8f is a transmission electron microscope image of the first ZnSe quantum dots obtained by performing step S103 thirteen times. The average particle size of the first ZnSe quantum dots is 13.4 nm, and the standard deviation is 1.3 nm. FIG. 8g is a transmission electron microscope image of the first ZnSe quantum dots obtained by performing step S103 twenty times. The average particle size of the first ZnSe quantum dots is 17.6 nm, and the standard deviation is 1.4 nm. The average particle size of the first ZnSe quantum dots illustrated in FIG. 8h is 27.1 nm with a standard deviation of 1.9 nm. The first ZnSe quantum dots of FIG. 8h can be obtained as follows: take a certain proportion (for example, one-fifth, one-tenth) of the amount of the first ZnSe quantum dot solution of FIG. 8g, and repeat the step S103 five times on the basis of the first ZnSe quantum dot obtained in FIG. 8g, then add excess n-hexane to the solution to stop the reaction, and transfer the above solution to a centrifuge tube to obtain the first ZnSe quantum dots with the average particle size of 27.1 nm and the standard deviation of 1.9 nm. The reason for such operation is that if the first ZnSe quantum dots with the average particle size of 27.1 nm are obtained by directly performing step S103 several times, a large amount of precursor raw materials are required, and the reaction time needs to be very long. By taking a certain amount of the solution of the first ZnSe quantum dot with an average particle size of 17.6 nm, and repeating step S103 on the basis of the first ZnSe quantum dot with the average particle size of 17.6 nm to obtain the first ZnSe quantum dots with the average particle size of 27.1 nm, which can greatly reduce the amount of precursor raw materials, and can significantly shorten the reaction time. The average particle size of the first ZnSe quantum dots illustrated in FIG. 8i is 35.2 nm with a standard deviation of 2.4 nm. The first ZnSe quantum dots of FIG. 8i can be obtained as follows: take a certain proportion (for example, one-fifth, one-tenth) of the amount of the first ZnSe quantum dot solution corresponding to FIG. 8h, and repeat step S103 four times on the basis of the first ZnSe quantum dot of FIG. 8h, and then add excess n-hexane to the solution to make the reaction stop and transfer the above solution into a centrifuge tube to obtain the first ZnSe quantum dots with the average particle size of 35.2 nm and the standard deviation of 2.4 nm.

The first ZnSe quantum dots prepared by the method 100 can be applied without growing shell layer on the surface of the quantum dots, for example, they can be applied to display products to provide blue light emission. Of course, in an alternative embodiment, the surface of the first ZnSe quantum dots can be continuously grown with a shell layer to form a second ZnSe quantum dot with a core-shell structure, so that the particle size of the second ZnSe quantum dot can be further increased, thereby helping to further improve the fluorescence quantum yield of the second ZnSe quantum dots.

The second ZnSe quantum dot with a core-shell structure is prepared by growing a shell layer on the surface of the first ZnSe quantum dot. Therefore, in the second ZnSe quantum dot, the first ZnSe quantum dot prepared by the aforementioned steps S101 to S103 may be referred to as the core of the second ZnSe quantum dot, and the shell layer grown on the surface of the first ZnSe quantum dot may be referred to as the shell of the second ZnSe quantum dot.

In some embodiments, after step S103, the method 100 may further comprise step S104: growing a shell layer on the surface of the first ZnSe quantum dot to form a second ZnSe quantum dot with a core-shell structure. Here, the first ZnSe quantum dot obtained by step S103 may be referred to as the core of the second ZnSe quantum dot with the core-shell structure, and the shell layer grown by step S104 may be referred to as the shell of the second ZnSe quantum dot with the core-shell structure. The band gap of the shell of the second ZnSe quantum dot needs to be larger than the band gap of the core of the second ZnSe quantum dot, thereby forming a "type I core-shell structure", so that both electrons and holes in the second ZnSe quantum dot can be confined in the core, thereby helping to further improve the chemical stability and fluorescence quantum yield of the second ZnSe quantum dot. In some embodiments, one or more of ZnS, ZnSeS, MnS, MnO may be used to form the shell of the second ZnSe quantum dot.

In some embodiments, step S104 may comprise the following sub-step S105: adding a sulfur precursor solution to the solution of the first ZnSe quantum dot obtained by step S103 to form a first ZnS shell on the surface of the first ZnSe quantum dot to form a second ZnSe quantum dot, and the second ZnSe quantum dot may be referred to as ZnSe/ZnS1 quantum dot for short. In one example, the sub-step S105 may comprise: at 300° C., adding the sulfur precursor solution to the solution of the first ZnSe quantum dot with an average particle size of 8.8 nm obtained in step S103, making the sulfur in the sulfur precursor solution to react with excess zinc in the solution of the first ZnSe quantum dot to form a first ZnS shell with a thickness of two atomic layers on the surface of the first ZnSe quantum dot, so as to form ZnSe/ZnS1 quantum dot with a core-shell structure. The sulfur precursor solution may comprise sulfur and n-trioctyl phosphine. The average particle size of the ZnSe/ZnS1 quantum dots is about 10.2 nm.

In some embodiments, step S104 may further comprise the following sub-step S106: adding a zinc sulfide precursor solution to the ZnSe/ZnS1 quantum dot solution obtained in step S105, the first ZnS shell continues to grow to form a second ZnS shell, thereby obtaining a second ZnSe quantum dot with a second ZnS shell grown on the surface of the first ZnSe quantum dot. The second ZnSe quantum dot may be referred to as ZnSe/ZnS2 quantum dot for short. In one example, sub-step S106 may comprise: at 280° C., adding the zinc sulfide precursor solution to the ZnSe/ZnS1 quantum dot solution at a rate of 4~8 mL/h, the first ZnS shell continues to epitaxially grow to form the second ZnS shell, and finally a second ZnS shell with a thickness of four atomic layers is formed on the surface of the first ZnSe quantum dot, so as to form ZnSe/ZnS2 quantum dot with a core-shell structure. The zinc sulfide precursor solution may comprise octanethiol, zinc acetate, oleylamine, octadecene. In one example, at 280° C., the zinc sulfide precursor solution is added to the ZnSe/ZnS1 quantum dot solution at a rate of 5 mL/h, wherein the molar ratio of octanethiol, zinc acetate and oleylamine in the zinc sulfide precursor solution is 1:1~1.5:1~1.5. Thus, the second ZnS shell with a thickness of four atomic layers is formed on the surface of the first ZnSe quantum dot, so as to form ZnSe/ZnS2 quantum dot with a core-shell structure. The average particle size of the ZnSe/ZnS2 quantum dots is about 11.8 nm, and the fluorescence quantum yield is about 60%. It can be seen that the fluorescence quantum yield of the ZnSe/ZnS2 quantum dots coated with the Zn—S shell is significantly improved compared to the ZnSe quantum dots which do not have shell. As known to those skilled in the art, the larger the particle size of the quantum dots, the more difficult it is to achieve high fluorescence quantum yield. The inventors of the present application found that the particle size of ZnSe quantum dots prepared in the related art cannot exceed 10 nm, and it is impossible to provide ZnSe quantum dots with both large particle size (e.g., greater than 10 nm) and high fluorescence quantum yield. In contrast, the second ZnSe quantum dots with the core-shell structure provided by the embodiments of the present disclosure can not only have a large particle size of 11.8 nm, but also have a high fluorescence quantum yield of 60%, which provides a great impetus for the application of ZnSe quantum dots in the display field.

It should be noted that, in sub-step S105, the first ZnS shell is formed on the surface of the first ZnSe quantum dots by adding the sulfur precursor solution. In sub-step S106, the second ZnS shell is formed on the surface of the first ZnSe quantum dots by adding the zinc sulfide precursor solution. That is, the precursors added in sub-step S105 and sub-step S106 are different. The inventors found that if the same precursor is used in sub-step S105 as in sub-step S106, that is, zinc sulfide precursor, the morphology of the ZnSe/ZnS2 quantum dots is relatively poor, which is not beneficial to improve the chemical stability and the fluorescence quantum yield of ZnSe/ZnS2 quantum dots. By using a sulfur precursor different from the zinc sulfide precursor in the sub-step S105, sulfur can act as a barrier layer, so that the ZnSe/ZnS2 quantum dots have better morphology, so that the chemical stability and fluorescence quantum yield of ZnSe/ZnS2 quantum dots can be improved.

Figure 9:
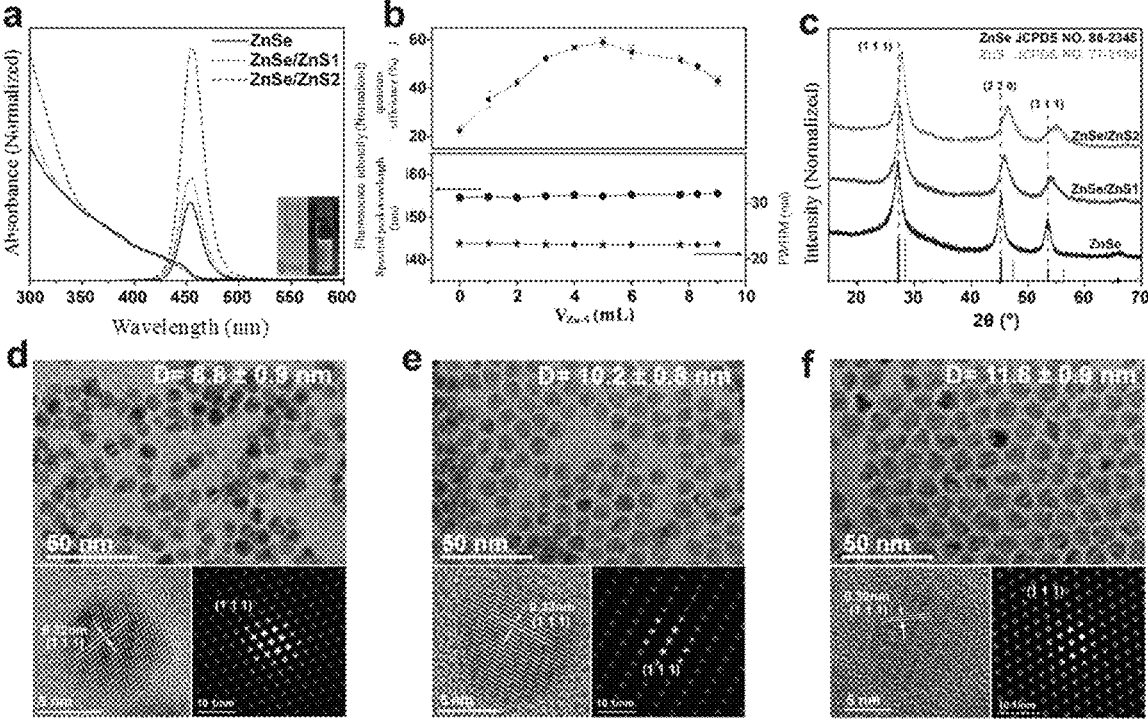
FIG. 9 illustrates (a) the absorption and emission spectra of the first ZnSe quantum dot, ZnSe/ZnS1 quantum dot, and ZnSe/ZnS2 quantum dot; (b) the variation trends of fluorescence quantum efficiency, emission peak wavelength, and full width at half maximum of ZnSe/ZnS2 quantum dot with the injection amount of Zn—S precursor; (c) the X-ray diffraction patterns of the first ZnSe quantum dot, ZnSe/ZnS1 quantum dot, and ZnSe/ZnS2 quantum dot; (d) a transmission electron microscope image and a fast Fourier transform image of the first ZnSe quantum dot; (e) a transmission electron microscope image and a fast Fourier transform image of the ZnSe/ZnS1 quantum dot; and (f) a transmission electron microscope image and a fast Fourier transform image of the ZnSe/ZnS2 quantum dot.

FIG. 9a illustrates the absorption spectra (three curves on the left in the figure) and fluorescence emission spectra (three curves on the right in the figure) of first ZnSe quantum dots, ZnSe/ZnS1 quantum dots growing the first ZnS shell, and ZnSe/ZnS2 quantum dots growing the second ZnS shell which emit light with wavelength of 455 nm. The test conditions corresponding to the three sets of absorption spectra are that the absorbance at 365 nm is 0.1, and the test conditions corresponding to the three sets of emission spectra are that the absorbance is 0.1 and excitation at 365 nm.

FIG. 9b illustrates variation trends of the fluorescence quantum efficiency (curve marked with black squares), emission peak wavelength (curve marked with black circles), and full with at half maximum (curve marked with black five-pointed stars) with the amount of Zn—S precursor in the process of growing the second ZnS shell of ZnSe/ZnS2 quantum dots. It can be seen from FIG. 9b that during the growing process of the second ZnS shell, the fluorescence quantum efficiency of ZnSe/ZnS2 quantum dots shows a trend of first increasing and then decreasing, and the emission peak wavelength and full with at half maximum hardly change.

FIG. 9c illustrates an X-ray diffraction pattern (XRD) of the first ZnSe quantum dot, ZnSe/ZnS1 quantum dot, and ZnSe/ZnS2 quantum dot. It can be seen from FIG. 9c that the diffraction peaks of the samples are shifted to large angles as the thickness of the ZnS shell increases.

FIG. 9d corresponds to the image of the first ZnSe quantum dots without the ZnS shell. The first ZnSe quantum dots are obtained by performing step S103 seven times, and the average particle size is 8.8 nm and the standard deviation is 0.9 nm. The lower left of FIG. 9d illustrates a high-resolution transmission electron microscope (HRTEM)

image of a first ZnSe quantum dot, and the lower right of FIG. 9d illustrates a fast Fourier transform (FFT) image of the entire first ZnSe quantum dot in high resolution.

FIG. 9e corresponds to the image of ZnSe/ZnS1 quantum dots. The conditions for forming the ZnSe/ZnS1 quantum dots are: at 300° C., injecting 1 mmol of sulfur precursor (1 mmol of sulfur powder dissolved in 1 mL of n-trioctylphosphine) into the solution of the first ZnSe quantum dot with an average particle size of 8.8 nm, and reacting for one hour to obtain ZnSe/ZnS1 quantum dots with an average particle size of 10.2 nm and a standard deviation of 0.8 nm. The lower left of FIG. 9e illustrates a high-resolution transmission electron microscope image of a ZnSe/ZnS1 quantum dot, and the lower right of FIG. 9e illustrates a fast Fourier transform image of the entire ZnSe/ZnS1 quantum dot in high resolution.

FIG. 9f corresponds to the image of ZnSe/ZnS2 quantum dots. The conditions for forming the ZnSe/ZnS2 quantum dots are as follows: at 280° C., slowly injecting (5 mL/h) 5 mL of 0.2 mol/L Zn—S precursor solution (1 mmol octanethiol, 1 mmol zinc acetate, 1.5 mL oleylamine, 3.5 mL octadecene, mixed and dissolved at 120° C.) into the solution of the ZnSe/ZnS1 quantum dot with an average particle size of 10.2 nm, to form ZnSe/ZnS2 quantum dots with an average particle size of 11.8 nm and a standard deviation of 0.9 nm. The fluorescence quantum dot yield of the ZnSe/ZnS2 quantum dots can reach 60%. The lower left of FIG. 9f illustrates a high-resolution transmission electron microscope image of a ZnSe/ZnS2 quantum dot, and the lower right of FIG. 9f illustrates a fast Fourier transform image of the entire ZnSe/ZnS2 quantum dot in high resolution.

The above are all taken ZnSe quantum dots as examples to introduce the method 100 for preparing quantum dots according to the embodiments of the present disclosure. But as mentioned above, the method 100 is not only applicable to the preparation of ZnSe quantum dots, but also applicable to the preparation of quantum dots of any other suitable material.

The following describes how to prepare CdSe quantum dots by the method 100 by taking CdSe quantum dots as an example.

Step S101: providing a first precursor solution, a second precursor solution, a first selenium precursor solution, and a second selenium precursor solution with a lower reaction activity than the first selenium precursor solution. Here, the first precursor solution is a first cadmium precursor solution, and the second precursor solution is a second cadmium precursor solution.

Preparation of the first cadmium precursor solution: weigh 8 mmol of cadmium oxide, 6 mL of oleic acid, 4 mL of oleylamine, and 30 mL of octadecene and mix them, stir the mixture under the protection of inert gas and heat the mixture, so as to obtain the first cadmium precursor solution.

Preparation of the second cadmium precursor solution: weigh 0.4 mmol of cadmium oxide, 0.5 mL of oleic acid, 0.5 mL of oleylamine, 10 mL of octadecene and mix them, stir the mixture under the protection of inert gas and heat the mixture to 280° C. to obtain the second cadmium precursor solution.

Preparation of the first selenium precursor solution: weigh 1 mmol of selenium powder and 2 mL of n-trioctylphosphine and mix them to obtain the first selenium precursor solution.

Preparation of the second selenium precursor solution: weigh 4 mmol of selenium powder and 20 mL of octadecene and mix them to obtain the second selenium precursor solution.

The following describes several CdSe quantum dots with different particle sizes and their preparation methods.

Figure 10:
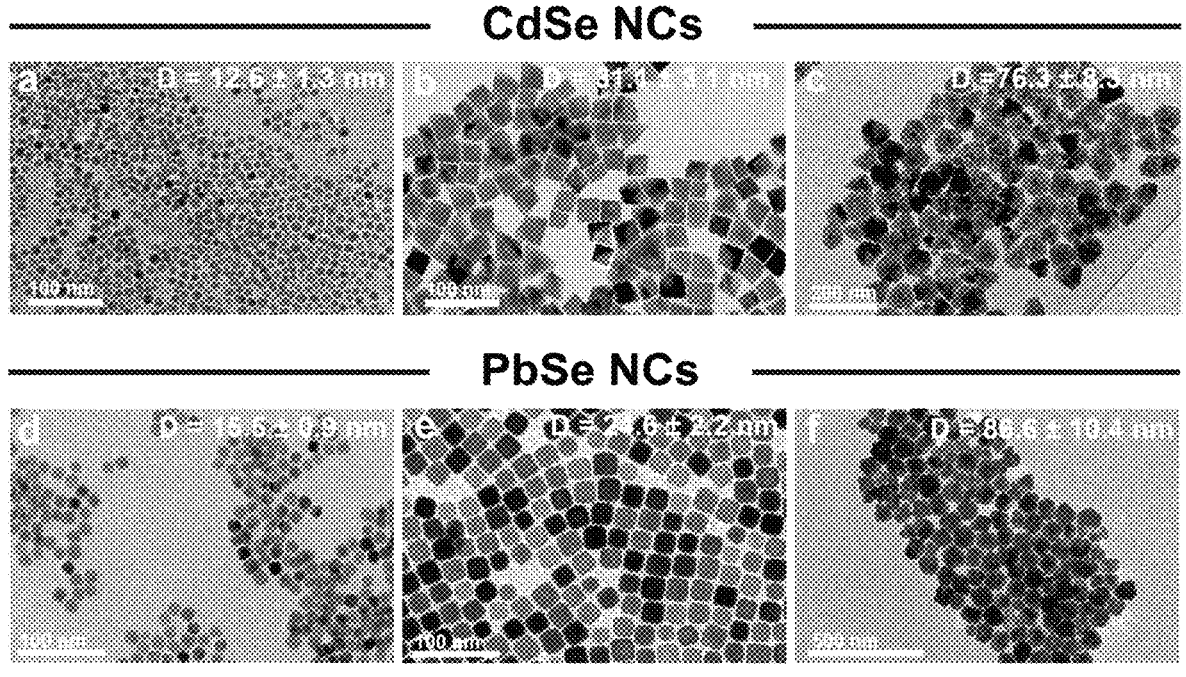
FIG. 10 illustrates (a~c) the transmission electron microscope images of CdSe quantum dots with different particle sizes prepared according to an embodiment of the present disclosure; and (d~f) the transmission electron microscope images of PbSe quantum dots with different particle sizes prepared according to an embodiment of the present disclosure.

FIG. 10a illustrates CdSe quantum dots with an average particle size of 12.6 nm and a standard deviation of 1.3 nm. The preparation method of the CdSe quantum dots is as follows: preparing the required precursor solutions according to the method of the above-mentioned step S101; then, in step S102, rapidly adding the first selenium precursor solution prepared in the above step S101 into the second cadmium precursor solution, and reacting for 30 minutes to obtain an intermediate of CdSe quantum dots with an average particle size of 4 nm; then in step S103, without cleaning the intermediate of the CdSe quantum dots, at 280° C., firstly adding the first cadmium precursor solution at room temperature prepared in step S101 to the intermediate of the CdSe quantum dots, and then adding the second selenium precursor solution at room temperature prepared in step S101 to the intermediate of the CdSe quantum dots, reacting for 15 minutes, and continuing to grow on the basis of the intermediate of CdSe quantum dots; repeating step S103 five times, then adding excess n-hexane to the above solution to stop the reaction, transferring the above solution to a centrifuge tube, and centrifuging at 7000 rpm for about 3 minutes, then pouring off the supernatant in the centrifuge tube. The CdSe quantum dots illustrated in FIG. 10a are finally obtained.

FIG. 10b illustrates CdSe quantum dots with an average particle size of 31.1 nm and a standard deviation of 3.1 nm. The preparation method of the CdSe quantum dots is as follows: step S103, taking one tenth of the amount of the solution of the CdSe quantum dot prepared above with the average particle size of 12.6 nm (to make it as an intermediate of the CdSe quantum dots), without cleaning, at 280° C., firstly adding the first cadmium precursor solution at room temperature prepared in step S101 to the solution of the intermediate of CdSe quantum dot, and then adding the second selenium precursor solution at room temperature prepared in step S101 to the solution of the intermediate of CdSe quantum dot, reacting for 15 minutes, and continuing to grow on the basis of the intermediate of CdSe quantum dot; repeating this step S103 four times, then adding excess n-hexane to the above solution to stop the reaction, and transferring the above solution to a centrifuge tube, centrifuging at 7000 rpm for about 3 minutes, and then pouring off the supernatant in the centrifuge tube. The CdSe quantum dots illustrated in FIG. 10b are finally obtained.

FIG. 10c illustrates CdSe quantum dots with an average particle size of 76.3 nm and a standard deviation of 8.3 nm. The preparation method of the CdSe quantum dots is as follows: step S103, taking one tenth of the amount of the solution of CdSe quantum dot prepared above with the average particle size of 31.1 nm (to make it as an intermediate of the CdSe quantum dots), without cleaning, at 280° C., firstly adding the first cadmium precursor solution at room temperature prepared in step S101 to the solution of the intermediate of CdSe quantum dot, and then adding the second selenium precursor solution at room temperature prepared in step S101 to the solution of the intermediate of CdSe quantum dot, reacting for 15 minutes, and continuing to grow on the basis of the intermediate of CdSe quantum dot; repeating step S103 five times, then adding excess n-hexane to the above solution to stop the reaction, transferring the above solution to a centrifuge tube, and centrifuging at 7000 rpm for about 3 minutes, then pouring off the supernatant in the centrifuge tube. The CdSe quantum dots illustrated in FIG. 10c are finally obtained.

The particle size of the CdSe quantum dots prepared by the method 100 can be adjusted within 4 nm~76.3 nm.

Next, PbSe quantum dots are taken as an example to describe how to prepare PbSe quantum dots by the method 100.

Step S101: providing a first precursor solution, a second precursor solution, a first selenium precursor solution, and a second selenium precursor solution with a lower reaction activity than the first selenium precursor solution. Here, the first precursor solution is a first lead precursor solution, and the second precursor solution is a second lead precursor solution.

Preparation of the first lead precursor solution: weigh 8 mmol of lead oxide, 6 mL of oleic acid, 4 mL of oleylamine, and 30 mL of octadecene and mix them, stir the mixture under the protection of inert gas and heat the mixture, to obtain the first lead precursor solution.

Preparation of the second lead precursor solution: weigh 0.4 mmol of cadmium oxide, 0.5 mL of oleic acid, 0.5 mL of oleylamine, 10 mL of octadecene and mix them, stir the mixture under the protection of inert gas and heat the mixture to 220° C., to obtain the second lead precursor solution.

Preparation of the first selenium precursor solution: weigh 1 mmol of selenium powder and 2 mL of n-trioctylphosphine and mix them to obtain the first selenium precursor solution.

Preparation of the second selenium precursor solution: weigh 4 mmol of selenium powder and 20 mL of octadecene and mix them to obtain the second selenium precursor solution.

The following describes several PbSe quantum dots with different particle sizes and their preparation methods.

FIG. 10d illustrates PbSe quantum dots with an average particle size of 15.5 nm and a standard deviation of 0.9 nm. The preparation method of the PbSe quantum dots is as follows: preparing the required precursor solutions according to the method of the above-mentioned step S101; then, in step S102, rapidly adding the first selenium precursor solution prepared in the above step S101 into the second lead precursor solution, and reacting for 10 minutes to obtain an intermediate of PbSe quantum dots with an average particle size of 4.7 nm; then in step S103, without cleaning the intermediate of the PbSe quantum dots, at 200° C., firstly adding the first lead precursor solution at room temperature prepared in step S101 to the intermediate of the PbSe quantum dots, and then adding the second selenium precursor solution at room temperature prepared in step S101 to the intermediate of the PbSe quantum dots, reacting for 5 minutes, and continuing to grow on the basis of the intermediate of PbSe quantum dots; repeating step S103 four times, then adding excess n-hexane to the above solution to stop the reaction, transferring the above solution to a centrifuge tube, and centrifuging at 7000 rpm for about 3 minutes, then pouring off the supernatant in the centrifuge tube. The PbSe quantum dots illustrated in FIG. 10d are finally obtained.

FIG. 10e illustrates PbSe quantum dots with an average particle size of 24.6 nm and a standard deviation of 2.2 nm. The preparation method of the PbSe quantum dots is as follows: step S103, taking one tenth of the amount of the solution of the PbSe quantum dot prepared above with the average particle size of 15.5 nm (to make it as an intermediate of the PbSe quantum dots), without cleaning, at 200° C., firstly adding the first lead precursor solution at room temperature prepared in step S101 to the solution of the intermediate of PbSe quantum dot, and then adding the second selenium precursor solution at room temperature prepared in step S101 to the solution of the intermediate of PbSe quantum dot, reacting for 5 minutes, and continuing to grow on the basis of the intermediate of PbSe quantum dot; repeating this step S103 four times, then adding excess n-hexane to the above solution to stop the reaction, and transferring the above solution to a centrifuge tube, centrifuging at 7000 rpm for about 3 minutes, and then pouring off the supernatant in the centrifuge tube. The PbSe quantum dots illustrated in FIG. 10e are finally obtained.

FIG. 10f illustrates PbSe quantum dots with an average particle size of 86.6 nm and a standard deviation of 10.4 nm. The preparation method of the PbSe quantum dots is as follows: step S103, taking one tenth of the amount of the solution of PbSe quantum dot prepared above with the average particle size of 24.6 nm (to make it as an intermediate of the PbSe quantum dots), without cleaning, at 200° C., firstly adding the first lead precursor solution at room temperature prepared in step S101 to the solution of the intermediate of PbSe quantum dot, and then adding the second selenium precursor solution at room temperature prepared in step S101 to the solution of the intermediate of PbSe quantum dot, reacting for 5 minutes, and continuing to grow on the basis of the intermediate of PbSe quantum dot; repeating step S103 ten times, then adding excess n-hexane to the above solution to stop the reaction, transferring the above solution to a centrifuge tube, and centrifuging at 7000 rpm for about 3 minutes, then pouring off the supernatant in the centrifuge tube. The PbSe quantum dots illustrated in FIG. 10f are finally obtained.

The particle size of the PbSe quantum dots prepared by the method 100 can be adjusted within 4 nm~86.6 nm.

According to another aspect of the present disclosure, a quantum dot is provided, and the quantum dot can be prepared by the method described in any one of the foregoing embodiments. The quantum dot comprises but is not limited to ZnSe quantum dot, CdSe quantum dot, and PbSe quantum dot.

As an example, the particle size of the ZnSe quantum dots provided by the embodiments of the present disclosure may be in the range of 2.0~35.2 nm, such as 8.3 nm, 10.3 nm, 13.4 nm, 17.6 nm, 27.1 nm, 35.2 nm.

As another example, the fluorescence full width at half maximum of the ZnSe quantum dots provided by the embodiments of the present disclosure is less than 30 nm.

As yet another example, the fluorescence emission peak of the ZnSe quantum dots provided by the embodiments of the present disclosure can be in the range of 455~470 nm, such as 455 nm, 458 nm, 465 nm, 470 nm.

The ZnSe quantum dots provided by the embodiments of the present disclosure can achieve a fluorescence emission peak greater than 455 mn and a particle size greater than 10 nm, and can solve the problems in the related art that the fluorescence emission peak of ZnSe quantum dots cannot exceed 455 nm and the particle size of ZnSe quantum dots cannot exceed 10 nm, which is beneficial to reduce or even avoid the damage of harmful blue light (wavelength in the range of 400~450 nm) to human eyes. The ZnSe quantum dots are environmentally friendly and pollution-free, and have good stability to water, oxygen, etc., and can be widely used in the display field. The above-mentioned ZnSe quantum dots can be applied to products alone to provide blue light emission, or can be applied to products after cladding shell.

In some embodiments, the ZnSe quantum dot with a core-shell structure can be formed by growing a shell layer on the surface of the above-mentioned ZnSe quantum dots.

The band gap of the shell of the ZnSe quantum dot is larger than that of the core of the ZnSe quantum dot, thereby forming a "type I core-shell structure", so that both electrons and holes in the ZnSe quantum dot can be confined in the core, thereby helping to further improve the chemical stability and fluorescence quantum yield of ZnSe quantum dots. The material of the shell of the ZnSe quantum dots may be any suitable material, which is not specifically limited in the embodiments of the present disclosure. For example, the material of the shell may be selected from one or more of ZnS, ZnSeS, MnS, and MnO. In some examples, the material of the shell of the ZnSe quantum dot is ZnS, and the thickness of the ZnS shell is two atomic layers. In some alternative embodiments, the material of the shell of the ZnSe quantum dot is ZnS, the thickness of the ZnS shell is four atomic layers, and the fluorescence quantum yield of the ZnSe quantum dot can reach 60%. As known to those skilled in the art, the larger the particle size of the quantum dots, the more difficult it is to achieve high fluorescence quantum yield. The inventors of the present application found that the particle size of ZnSe quantum dots prepared in the related art cannot exceed 10 nm, and it is impossible to provide ZnSe quantum dots with both large particle size (e.g., greater than 10 nm) and high fluorescence quantum yield. In contrast, the ZnSe quantum dots with the core-shell structure provided by the embodiments of the present disclosure can not only have a large particle size (for example, 11.8 nm), but also have a high fluorescence quantum yield of 60%, which provides a great impetus for the application of ZnSe quantum dots in the display field.

In the embodiment in which the quantum dots are CdSe quantum dots, the particle size of the CdSe quantum dots can be adjusted in the range of 4.0 nm to 76.3 nm. In the embodiment in which the quantum dots are PbSe quantum dots, the particle size of the PbSe quantum dots can be adjusted in the range of 4.0 nm to 86.6 nm.

According to yet another aspect of the present disclosure, there is provided a display device that may comprise the quantum dots described in any of the preceding embodiments, such as ZnSe quantum dots, CdSe quantum dots, or PbSe quantum dots.

Figure 11:
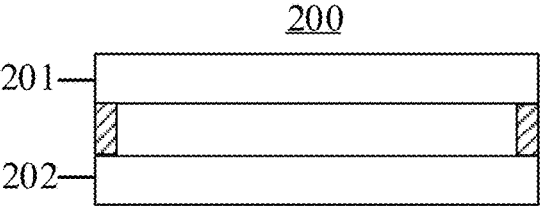
FIG. 11 illustrates a schematic structural diagram of a display device comprising the quantum dot according to an embodiment of the present disclosure.

FIG. 11 illustrates a schematic structural diagram of a display device 200. As illustrated in FIG. 11, the display device 200 comprises a first substrate 201 and a second substrate 202 arranged opposite to each other and other necessary elements arranged therebetween. The display device 200 comprises, but is not limited to, a liquid crystal display (LCD), an organic light emitting diode (OLED) display device, a micro light emitting diode (Micro LED) display device, and the like.

The display device 200 comprises an optoelectronic element, and the optoelectronic element may be, for example, a color filter, a backlight source, a light-emitting device and other elements comprising the above-mentioned ZnSe quantum dots. In one embodiment, utilizing the photoluminescence properties of ZnSe quantum dots, ZnSe quantum dots can be used as a blue color film in a liquid crystal display device and/or a blue light source for a backlight. In another embodiment, using the electroluminescence properties of ZnSe quantum dots, ZnSe quantum dots can be used to fabricate light-emitting devices, such as quantum dot light-emitting diodes (QLED). The QLED comprises a cathode, an electron transport layer, a ZnSe quantum dot layer, a hole transport layer, a hole injection layer, an anode and other structures. When a voltage is applied between the anode and the cathode, under the action of the electric field, the cathode and the anode generate electrons and holes, respectively, and the electrons and holes are transported into the ZnSe quantum dot layer through the corresponding film layer, and recombined into excitons in the ZnSe quantum dot layer, resulting in energy level transition, thereby emitting light. Depending on the specific design requirements, the QLED can be of an upside structure or a flip structure, and can be of a top emission type or a bottom emission type. Compared with traditional organic light-emitting diodes, the QLED has better color purity, better contrast and stronger stability.

The display device provided by the embodiments of the present disclosure may have substantially the same technical effects as the quantum dots described in the previous embodiments, and therefore, for the sake of brevity, the description is not repeated here.

As those skilled in the art will appreciate, although the various steps of the methods in the disclosed embodiments are depicted in the figures in a particular order, this does not require or imply that the steps must be performed in that particular order, unless the context clearly dictates otherwise. Additionally or alternatively, multiple steps may be combined into one step for execution, and/or one step may be decomposed into multiple steps for execution. Furthermore, other method steps may be inserted between the steps. The inserted steps may represent improvements to the method such as those described herein, or may be unrelated to the method. In addition, a given step may not be fully completed before the next step begins.

In the description of the present disclosure, the terms "upper", "lower", "left", "right", etc. indicate the orientation or positional relationship based on the orientation or positional relationship illustrated in the drawings, and are only used to facilitate the description of the present disclosure. It is not required that the present disclosure must be constructed and operated in a specific orientation, and therefore cannot be understood as a limitation to the present disclosure.

In the description of this specification, the description with reference to the terms "one embodiment", "another embodiment", etc. means that a specific feature, structure, material, or characteristic described in conjunction with the embodiment is comprised in at least one embodiment of the present disclosure. In this specification, the schematic representations of the above terms do not necessarily refer to the same embodiment or example. Moreover, the described specific feature, structure, material or characteristic can be combined in any one or more embodiments or examples in a suitable manner. In addition, those skilled in the art can combine the different embodiments or examples and the features in the different embodiments or examples described in this specification without contradicting each other. In addition, it should be noted that in this specification, the terms "first" and "second" are only used for descriptive purposes, and cannot be understood as indicating or implying relative importance or implicitly indicating the number of indicated technical features.

The above are only specific implementations of the present disclosure, but the protection scope of the present disclosure is not limited thereto. Any person familiar with the technical field can easily think of changes or substitutions within the technical scope disclosed in the present disclosure, and they should be covered by the protection scope of the present disclosure. Therefore, the protection scope of the present disclosure should be subject to the protection scope of the claims.

The invention claimed is:
1. A method for preparing a quantum dot, comprising:

providing a first precursor solution, a second precursor solution, a first selenium precursor solution, and a second selenium precursor solution with a lower reaction activity than the first selenium precursor solution;

adding the first selenium precursor solution to the second precursor solution to form an intermediate of the quantum dot; and performing the following operation at least once to form the quantum dot: adding the first precursor solution and the second selenium precursor solution to the intermediate of the quantum dot and making them react, wherein the first precursor solution is selected from one of a first zinc precursor solution, a first cadmium precursor solution, or a first lead precursor solution, and the second precursor solution is selected from one of a second zinc precursor solution, a second cadmium precursor solution, or a second lead precursor solution.

2. The method of claim 1, wherein the selenium precursor is selected from one of selenium dioxide, selenium trioxide, selenium powder, sodium selenate, or selenourea.

3. The method of claim 1, wherein the first selenium precursor solvent comprises a phosphine solvent with active electrons.

4. The method of claim 3, wherein the phosphine solvent is selected from one of trioctylphosphine, trioctylphosphine oxide, tributylphosphine, tris(trimethylsilyl)phosphine, tris(dimethylamino)phosphine, diphenylphosphine, diethylphosphine, bis(2-methoxyphenyl)phosphine, or tris(diethylamino)phosphine.

5. The method of claim 1, wherein the second selenium precursor solvent comprises an inert solvent.

6. The method of claim 5, wherein the inert solvent is selected from one of tetradecane, hexadecane, octadecane, eicosane, tetracosane, octadecene, phenyl ether, benzyl ether, liquid paraffin, mineral oil, dodecylamine, hexadecylamine, or octadecylamine.

7. The method of claim 1, wherein the providing the first precursor solution, the second precursor solution, the first selenium precursor solution, and the second selenium precursor solution with the lower reaction activity than the first selenium precursor solution, comprises:

mixing a selenium precursor and a first selenium precursor solvent in a ratio of 0.1~10 mmol:1~20 mL to form the first selenium precursor solution.

8. The method of claim 1, wherein the providing the first precursor solution, the second precursor solution, the first selenium precursor solution, and the second selenium precursor solution with the lower reaction activity than the first selenium precursor solution, comprises:

mixing a selenium precursor and a second selenium precursor solvent in a ratio of 0.1~10 mmol:1~20 mL to form the second selenium precursor solution.

9. The method of claim 1, wherein the first precursor solution is the first zinc precursor solution, the second precursor solution is the second zinc precursor solution, and the quantum dot is a first ZnSe quantum dot.

10. The method of claim 9, wherein a material of a solute in the first zinc precursor solution is the same as a material of a solute in the second zinc precursor solution, a material of a solvent in the first zinc precursor solution is the same as a material of a solvent in the second zinc precursor solution, and a ratio of solute to solvent in the first zinc precursor solution is different from a ratio of solute to solvent in the second zinc precursor solution.

11. The method of claim 10, wherein the providing the first precursor solution, the second precursor solution, the first selenium precursor solution, and the second selenium precursor solution with the lower reaction activity than the first selenium precursor solution, comprises:

mixing zinc inorganic salt, organic acid, organic amine and inert solvent in the ratio of 1~10 mmol:1~10 mmol:1~10 mL:10~50 mL, stirring the mixture under protection of inert gas and heating the mixture until clear to form the first zinc precursor solution.

12. The method of claim 10, wherein the providing the first precursor solution, the second precursor solution, the first selenium precursor solution, and the second selenium precursor solution with the lower reaction activity than the first selenium precursor solution, comprises:

mixing zinc inorganic salt, organic acid, organic amine and inert solvent in a ratio of 0.1~10 mmol:1~10 mL:1~10 mL:1~20 mL, stirring the mixture under protection of inert gas and heating the mixture to 250° C.~350° C. to form the second zinc precursor solution.

13. The method of claim 12, wherein the adding the first selenium precursor solution to the second precursor solution to form the intermediate of the quantum dot, comprises:

dissolving selenium powder in diphenylphosphine to form the first selenium precursor solution;

using oleic acid as the organic acid in the second zinc precursor solution and oleylamine as the organic amine in the second zinc precursor solution, a molar ratio of the oleic acid to oleylamine being 0.2:1; and adding the first selenium precursor solution to the second zinc precursor solution to form the intermediate of the first ZnSe quantum dot with a particle size of about 4.7 nm.

14. The method of claim 9, after the performing the following operation at least once to form the quantum dot, further comprising: growing a shell layer on a surface of the first ZnSe quantum dot to form a second ZnSe quantum dot with a core-shell structure, wherein the first ZnSe quantum dot is the core of the second ZnSe quantum dot.

15. The method of claim 14, wherein a band gap of the shell of the second ZnSe quantum dot is greater than a band gap of the core of the second ZnSe quantum dot.

16. The method of claim 15, wherein the shell of the second ZnSe quantum dot is formed by using one or more of ZnS, ZnSeS, MnS, MnO.

17. The method of claim 16, wherein the growing the shell layer on the surface of the first ZnSe quantum dot to form the second ZnSe quantum dot with the core-shell structure, comprises:

adding a sulfur precursor solution to a solution of the first ZnSe quantum dot to grow a first ZnS shell on the surface of the first ZnSe quantum dot to form the second ZnSe quantum dot.

18. The method of claim 17, wherein the adding the sulfur precursor solution to the solution of the first ZnSe quantum dot to grow the first ZnS shell on the surface of the first ZnSe quantum dot, comprises:

adding the sulfur precursor solution to the solution of the first ZnSe quantum dot at 300° C., to form the first ZnS shell with a thickness of two atomic layers on the surface of the first ZnSe quantum dot.

19. The method of claim 17, wherein the sulfur precursor solution comprises sulfur and trioctyl phosphine.

20. The method of claim 17, wherein an average particle size of the second ZnSe quantum dot with the first ZnS shell is about 10.2 nm.

21. The method of claim 17, wherein the growing the shell layer on the surface of the first ZnSe quantum dot to form the second ZnSe quantum dot with the core-shell structure, comprises:

adding a zinc sulfide precursor solution to a solution of the second ZnSe quantum dot with the first ZnS shell to continue growth of the first ZnS shell to form a second ZnS shell.

22. The method of claim 21, wherein the second ZnS shell has a thickness of four atomic layers.

23. The method of claim 21, wherein the growing the shell layer on the surface of the first ZnSe quantum dot to form the second ZnSe quantum dot with the core-shell structure, comprises:

adding the zinc sulfide precursor solution to the solution of the second ZnSe quantum dot with the first ZnS shell at a rate of 4-8 mL/h at 280° C., so that the first ZnS shell continues to grow to form the second ZnS shell on the surface of the first ZnSe quantum dot.

24. The method of claim 21, wherein the zinc sulfide precursor solution comprises octanethiol, zinc acetate, oleylamine, octadecene.

25. The method of claim 24, wherein a molar ratio of octanethiol, zinc acetate, and oleylamine in the zinc sulfide precursor solution is 1:1~1.5:1~1.5.

26. The method of claim 21, wherein an average particle size of the second ZnSe quantum dot with the second ZnS shell is about 11.8 nm.

27. The method of claim 21, wherein a fluorescence quantum yield of the second ZnSe quantum dot with the second ZnS shell is about 60%.

28. The method of claim 1, wherein the first precursor solution is the first cadmium precursor solution, the second precursor solution is the second cadmium precursor solution, and the quantum dot is CdSe quantum dot.

29. The method of claim 1, wherein the first precursor solution is the first lead precursor solution, the second precursor solution is the second lead precursor solution, and the quantum dot is PbSe quantum dot.

30. A quantum dot having a core-shell structure, wherein a material of the core is ZnSe and a material of the shell is ZnS, and the shell has a thickness of two atomic layers or four atomic layers.

31. The quantum dot of claim 30, wherein the shell has the thickness of four atomic layers, and a fluorescence quantum yield of the quantum dot is about 60%.

32. The quantum dot of claim 30, wherein a wavelength of a fluorescence emission peak of the core is greater than 455 nm and less than or equal to 470 nm.

33. A display device comprising the quantum dot of claim 30.

* * * * *